(12) United States Patent
Nam et al.

(10) Patent No.: US 12,446,235 B2
(45) Date of Patent: Oct. 14, 2025

(54) INTEGRATED CIRCUIT DEVICE WITH VERTICAL CELL ARRAY AND THROUGH ELECTRODES

(71) Applicant: SAMSUNG ELECTRONICS CO., LTD., Suwon-si (KR)

(72) Inventors: Sangwan Nam, Busan (KR); Yongseok Kwon, Seoul (KR); Hongsoo Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 331 days.

(21) Appl. No.: 16/935,607

(22) Filed: Jul. 22, 2020

(65) Prior Publication Data

US 2021/0202496 A1  Jul. 1, 2021

(30) Foreign Application Priority Data

Dec. 31, 2019  (KR) .......................... 10-2019-0179799

(51) Int. Cl.
*H01L 27/115*  (2017.01)
*H01L 23/48*  (2006.01)
(Continued)

(52) U.S. Cl.
CPC ........... *H10B 69/00* (2023.02); *H01L 23/481* (2013.01); *H01L 23/5226* (2013.01)

(58) Field of Classification Search
CPC ........ H01L 27/11575; H01L 27/11565; H01L 27/1157; H01L 27/11573; H01L 27/11582;
(Continued)

(56) References Cited

U.S. PATENT DOCUMENTS 8,044,448 B2 * 10/2011 Kamigaichi ........... G11C 5/063
257/296
9,099,347 B2 *  8/2015 Yun .................... H01L 27/11582
(Continued)

FOREIGN PATENT DOCUMENTS

KR   10-2016-0069903 A   6/2016
KR     1020190118751 A   10/2019

OTHER PUBLICATIONS

Notice of Allowance dated Nov. 13, 2024 issued in Korean Patent Application No. 10-2019-0179799.

*Primary Examiner* — Ajay Ojha
*Assistant Examiner* — Tsz K Chiu
(74) *Attorney, Agent, or Firm* — Morgan, Lewis & Bockius LLP

(57) ABSTRACT

An integrated circuit device includes; a peripheral circuit structure, a cell array structure including gate lines overlapping the peripheral circuit structure and disposed on the peripheral circuit structure in a vertical direction, a conductive plate interposed between the peripheral circuit structure and the cell array structure and including through holes, conductive lines spaced apart from the conductive plate with the cell array structure interposed between the conductive lines and the conductive plate, and through electrodes connected to the conductive lines and extending to the peripheral circuit structure through the cell array structure and the through holes. The through holes include a first through holes arranged along a first straight line extending in a first horizontal direction, and second through holes arranged along a second straight line extending in parallel with the first straight line and spaced apart from the first straight line in a second horizontal direction.

20 Claims, 21 Drawing Sheets

(51) Int. Cl.
  *H01L 23/522*  (2006.01)
  *H01L 27/11573*  (2017.01)
  *H01L 27/11582*  (2017.01)
  *H10B 69/00*  (2023.01)

(58) Field of Classification Search
  CPC ......... H01L 27/11524; H01L 27/11526; H01L 27/11551; H01L 23/5226; H01L 23/5283; H01L 21/76816; H01L 21/76865; H01L 21/76877; H01L 21/76831; H10B 43/27; H10B 41/35; H10B 41/41; H10B 41/27; H10B 43/35; H10B 43/40; H10B 43/10; H10B 43/50
  See application file for complete search history.

(56) References Cited

U.S. PATENT DOCUMENTS

| | | | |
|---|---|---|---|
| 9,741,733 B2 | 8/2017 | Lim et al. | |
| 9,887,208 B2* | 2/2018 | Son | H10B 43/40 |
| 9,953,993 B2* | 4/2018 | Utsumi | H10B 43/10 |
| 10,249,640 B2* | 4/2019 | Yu | H01L 27/11573 |
| 10,381,370 B2 | 8/2019 | Shin et al. | |
| 10,381,371 B2* | 8/2019 | Ogawa | H01L 23/5226 |
| 10,522,228 B2* | 12/2019 | Tanaka | G11C 19/28 |
| 10,950,615 B2* | 3/2021 | Watanabe | H10B 43/20 |
| 11,282,783 B2* | 3/2022 | Otsu | H01L 23/5283 |
| 11,282,827 B2* | 3/2022 | Yun | H01L 27/11565 |
| 11,342,353 B2* | 5/2022 | Oh | H01L 29/66545 |
| 2013/0273700 A1* | 10/2013 | Rabkin | H10B 43/40 438/510 |
| 2017/0069651 A1* | 3/2017 | Sakamoto | H10B 43/40 |
| 2017/0098658 A1* | 4/2017 | Matsuda | H10B 41/10 |
| 2017/0179026 A1* | 6/2017 | Toyama | H10B 41/41 |
| 2017/0338241 A1* | 11/2017 | Lee | H01L 29/66833 |
| 2018/0026044 A1* | 1/2018 | Utsumi | H10B 41/35 257/314 |
| 2018/0211967 A1* | 7/2018 | Shimojo | H10B 41/40 |
| 2018/0261608 A1* | 9/2018 | Matsuura | H10B 43/35 |
| 2018/0342455 A1* | 11/2018 | Nosho | H01L 23/53238 |
| 2019/0027490 A1 | 1/2019 | Shin et al. | |
| 2019/0043879 A1* | 2/2019 | Lu | H10B 43/10 |
| 2019/0057974 A1 | 2/2019 | Lu et al. | |
| 2019/0081017 A1 | 3/2019 | Nakajima | |
| 2019/0115357 A1* | 4/2019 | Oh | H01L 27/11582 |
| 2019/0122734 A1* | 4/2019 | Shibata | G11C 11/5642 |
| 2019/0172838 A1 | 6/2019 | Jo et al. | |
| 2019/0237472 A1 | 8/2019 | Oh et al. | |
| 2019/0252403 A1 | 8/2019 | Kaminaga et al. | |
| 2019/0319038 A1 | 10/2019 | Zhang | |
| 2019/0393241 A1* | 12/2019 | Baek | H10B 43/50 |
| 2020/0043830 A1* | 2/2020 | Baek | H10B 41/27 |
| 2020/0043942 A1* | 2/2020 | Shimojo | H10B 43/10 |
| 2020/0075623 A1* | 3/2020 | Ito | H10B 43/50 |
| 2020/0098782 A1* | 3/2020 | Nojima | H10B 43/27 |
| 2020/0295025 A1* | 9/2020 | Lu | H01L 27/11575 |
| 2023/0113904 A1* | 4/2023 | Oike | H10B 43/40 257/324 |

* cited by examiner

# INTEGRATED CIRCUIT DEVICE WITH VERTICAL CELL ARRAY AND THROUGH ELECTRODES

CROSS-REFERENCE TO RELATED APPLICATION

This application claims the benefit of Korean Patent Application No. 10-2019-0179799 filed on Dec. 31, 2019 in the Korean Intellectual Property Office, the subject matter of which is hereby incorporated by reference.

BACKGROUND

The inventive concept relates to integrated circuit device(s), and more particularly, to integrated circuit device(s) including a non-volatile memory device having a cell over periphery (COP) structure.

As the number and sophistication functions performed by contemporary information communication devices have increased, the constituent integrated circuit(s) (many of which include one or more memory circuits) included in such devices have necessarily increased in data storage capacity, data processing capabilities and overall integration density. The size of memory cells in these memory circuits has generally been reduced. And various circuitry, wiring structures, signal connections, etc. included in the memory circuits have become increasingly complicated. Accordingly, integrated circuit device(s) including memory circuit(s) should provide better data integrity and improved electrical characteristics.

SUMMARY

The inventive concept relates to integrated circuit devices having a structure providing improved electrical characteristics in a highly integrated memory device.

According to an aspect of the inventive concept, an integrated circuit device includes; a peripheral circuit structure, a cell array structure including gate lines overlapping the peripheral circuit structure and disposed on the peripheral circuit structure in a vertical direction, a conductive plate interposed between the peripheral circuit structure and the cell array structure and including through holes, conductive lines spaced apart from the conductive plate with the cell array structure interposed between the conductive lines and the conductive plate, and through electrodes connected to the conductive lines and extending to the peripheral circuit structure through the cell array structure and the through holes, wherein the through holes include first through holes arranged along a first straight line extending in a first horizontal direction, and second through holes arranged along a second straight line extending in parallel with the first straight line and spaced apart from the first straight line in a second horizontal direction.

According to an aspect of the inventive concept, an integrated circuit device includes; a cell array structure having a tile including memory stacks including gate lines and channel structures passing through the gate lines, a peripheral circuit structure overlapping the cell array structure in a vertical direction and including a peripheral circuit, and a conductive plate interposed between the peripheral circuit structure and the gate lines and including a tile region corresponding to the tile, wherein the conductive plate comprises through holes defining a zigzag type conductive path around a certain point selected in the tile region in a radial direction, and the through holes include first through holes arranged along a first straight line extending in a first horizontal direction and second through holes arranged along a second straight line extending in parallel with the first straight line, and spaced apart from the first straight line in a second horizontal direction.

According to an aspect of the inventive concept, an integrated circuit device includes; a peripheral circuit structure including a peripheral circuit, a common source line (CSL) plate formed on the peripheral circuit structure and including a tile region, and memory stacks arranged on the tile region of the CSL plate and overlapping the peripheral circuit structure in a vertical direction with the CSL plate interposed between the memory stacks and the peripheral circuit structure, wherein the CSL plate includes through holes passing through the CSL plate so as to limit a zigzag conductive path around a certain point in the tile region in a radial direction, and through holes including first through holes arranged along a first straight line extending in a first horizontal direction and second through holes arranged along a second straight line extending in parallel with the first straight line and spaced apart from the first straight line.

BRIEF DESCRIPTION OF THE DRAWINGS

Embodiments of the inventive concept will be more clearly understood from the following detailed description taken in conjunction with the accompanying drawings in which:

FIG. 9A is a plan view illustrating partial components of an integrated circuit device, FIG. 9B is a cross-sectional view illustrating enlargements of partial components taken along the lines Y1-Y1' and Y2-Y2' of FIG. 9A, and FIG. 9C is a plan view illustrating partial components of the integrated circuit device illustrated in FIG. 9A;

DETAILED DESCRIPTION

Hereinafter, embodiments of the inventive concept will be described in some additional detail with reference to the accompanying drawings. Throughout the written description and drawings, like reference numbers and labels denote like or similar elements.

Throughout the written description certain geometric terms are used to highlight relative element, component and/or feature relationships in certain embodiments of the inventive concept. Those skilled in the art will recognize that such terms are relative in nature, arbitrary in descriptive relations and/or directed to aspect(s) of the illustrated embodiments. Such terms may include, for example: above/below; under/over; upper/lower; uppermost/lowermost; center/edge; horizontal/vertical; surround; periphery; overlap/underlay; beside; adjacent; parallel, etc.

Figure (FIG.) 1 is a block diagram of an integrated circuit device 10 according to embodiments of the inventive concept.

Figure 1:
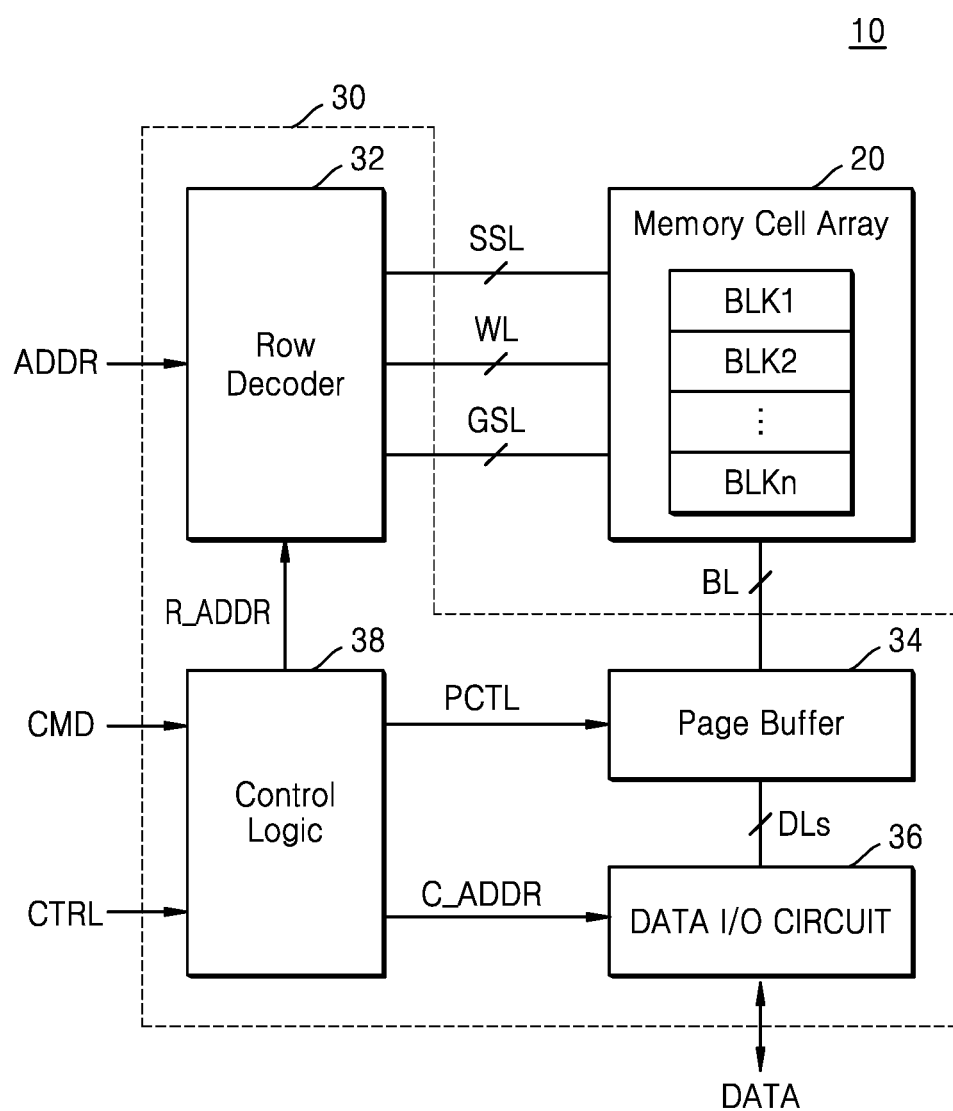
FIG. 1 is a block diagram of an integrated circuit device according to embodiments of the inventive concept.

Referring to FIG. 1, the integrated circuit device 10 may include a memory cell array 20 and a peripheral circuit 30. The memory cell array 20 includes a plurality of memory cell blocks BLK1, BLK2, . . . , and BLKn ("cell blocks"). Each of the cell blocks BLK1, BLK2, . . . , and BLKn may include a plurality of memory cells ("memory cells"). The cell blocks BLK1, BLK2, . . . , and BLKn may be connected to the peripheral circuit 30 through a plurality of bit lines BL ("bit lines"), word lines WL ("word lines"), at least one string selection line SSL, and/or at least one ground selection lines GSL.

The peripheral circuit 30 may include a row decoder 32, a page buffer 34, a data input and/or output ("I/O") circuit 36, and a control logic 38. Although not specifically illustrated in FIG. 1, the peripheral circuit 30 may further include one or more I/O interface(s), a column logic, a voltage generator, a pre-decoder, a temperature sensor, a command decoder, an address decoder, and an amplification circuit.

The memory cell array 20 may be connected to the page buffer 34 through the bit lines BL and may be connected to the row decoder 32 through the word lines WL, the string selection lines SSL, and the ground selection lines GSL. In the memory cell array 20, the memory cells included in each of the cell blocks BLK1, BLK2, . . . , and BLKn may be flash memory cells. The memory cell array 20 may include a three-dimensional (3D) or vertical memory cell array. The 3D memory cell array may include a plurality of NAND strings ("NAND strings"), where each of the NAND strings may include memory cells connected to one or more of the word lines WL that may be vertically stacked on a substrate.

The peripheral circuit 30 may receive an address ADDR, a command CMD, and/or a control signal CTRL that are externally provided to the integrated circuit device 10, and may transmit and/or receive (hereafter, "communicate") data (DATA) with an external device.

The row decoder 32 may select at least one of the cell blocks BLK1, BLK2, . . . , and BLKn in response to the address ADDR, and may select a word line WL, a string selection line SSL, and a ground selection line GSL associated with the selected cell block. The row decoder 32 may communicate at least one voltage for performing a memory operation to the word line WL of the selected cell block.

The page buffer 34 may be connected to the memory cell array 20 through the bit lines BL. The page buffer 34 may operate as a write driver during a write (or program) operation and may apply a voltage in accordance with the data to be stored in the memory cell array 20 to one or more of the bit lines BL, and may operate as a sense amplifier during a read operation and may sense the data stored in the memory cell array 20. The page buffer 34 may operate in accordance with a control signal PCTL provided by the control logic 38.

The data I/O circuit 36 may be connected to the page buffer 34 through data lines DLs. The data I/O circuit 36 may receive the data from (e.g.,) a memory controller (not shown in FIG. 1) during the program operation and may provide program data to the page buffer 34 based on a column address C_ADDR provided by the control logic 38. The data I/O circuit 36 may provide read data stored in the page buffer 34 to (e.g.,) the memory controller based on the column address C_ADDR provided by the control logic 38 during a read operation.

The data I/O circuit 36 may communicate an input address and/or command to the control logic 38 and/or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and may provide the column address C_ADDR to the data I/O circuit 36. The control logic 38 may generate various internal control signals used in the integrated circuit device 10 in response to the control signal CTRL. For example, the control logic 38 may adjust a level of a voltage provided to the word lines WL and the bit lines BL while a memory operation such as the program operation or an erase operation is performed.

Figure 2:
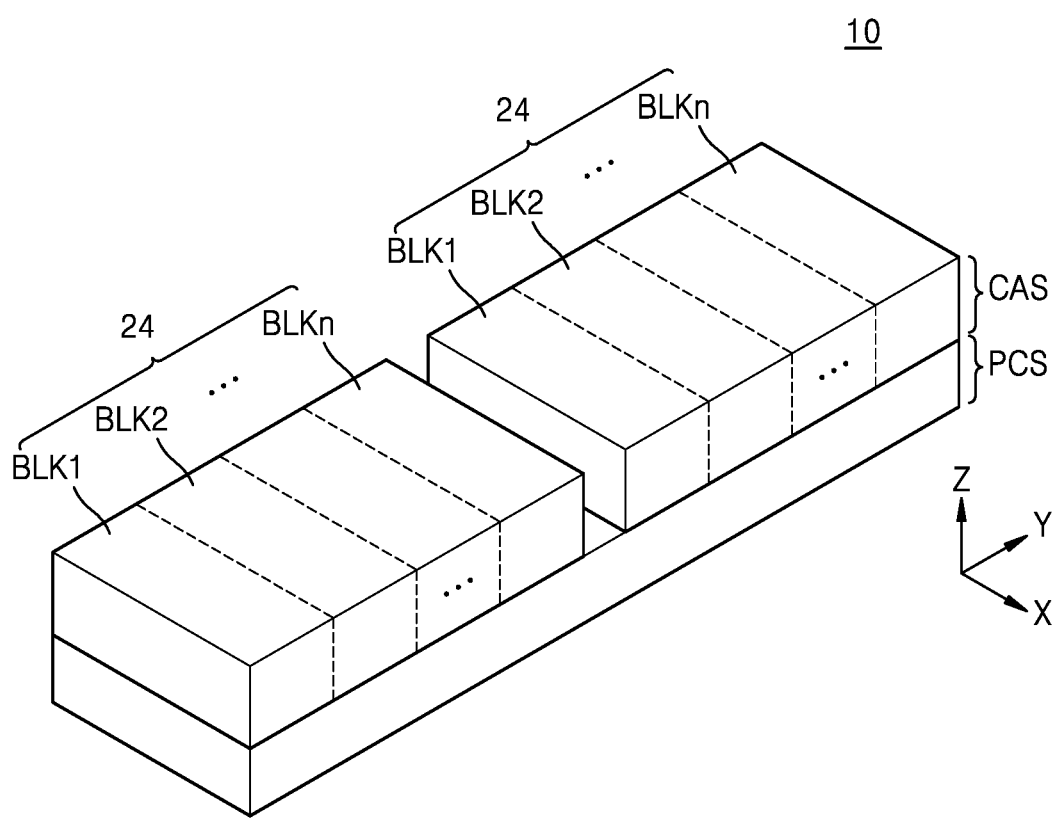
FIG. 2 is a perspective view of an integrated circuit device according to embodiments of the inventive concept.

FIG. 2 is a perspective view further illustrating one possible example of the integrated circuit device 10 of FIG. 1 according to embodiments of the inventive concept.

Referring to FIG. 2, the integrated circuit device 10 includes a cell array structure (CAS) and a peripheral circuit structure (PCS) that are overlaid (or overlap) in a vertical direction (or Z direction). The cell array structure (CAS) may include the memory cell array 20 of FIG. 1, and the peripheral circuit structure (PCS) may include the peripheral circuit 30 of FIG. 1, for example.

The cell array structure (CAS) may include a plurality of tiles 24 ("tiles"), where each of the tiles 24 may include cell blocks BLK1, BLK2, . . . , and BLKn. Each of the cell blocks BLK1, BLK2, . . . , and BLKn may include three-dimensional arrangement of memory cells.

In exemplary embodiments, two tiles 24 may be configured to form one (1) mat. The memory cell array 20 described with reference to FIG. 1 may include a plurality of mats ("mats") (e.g., four (4) mats). However, the inventive concept is not limited thereto.

Figure 3:
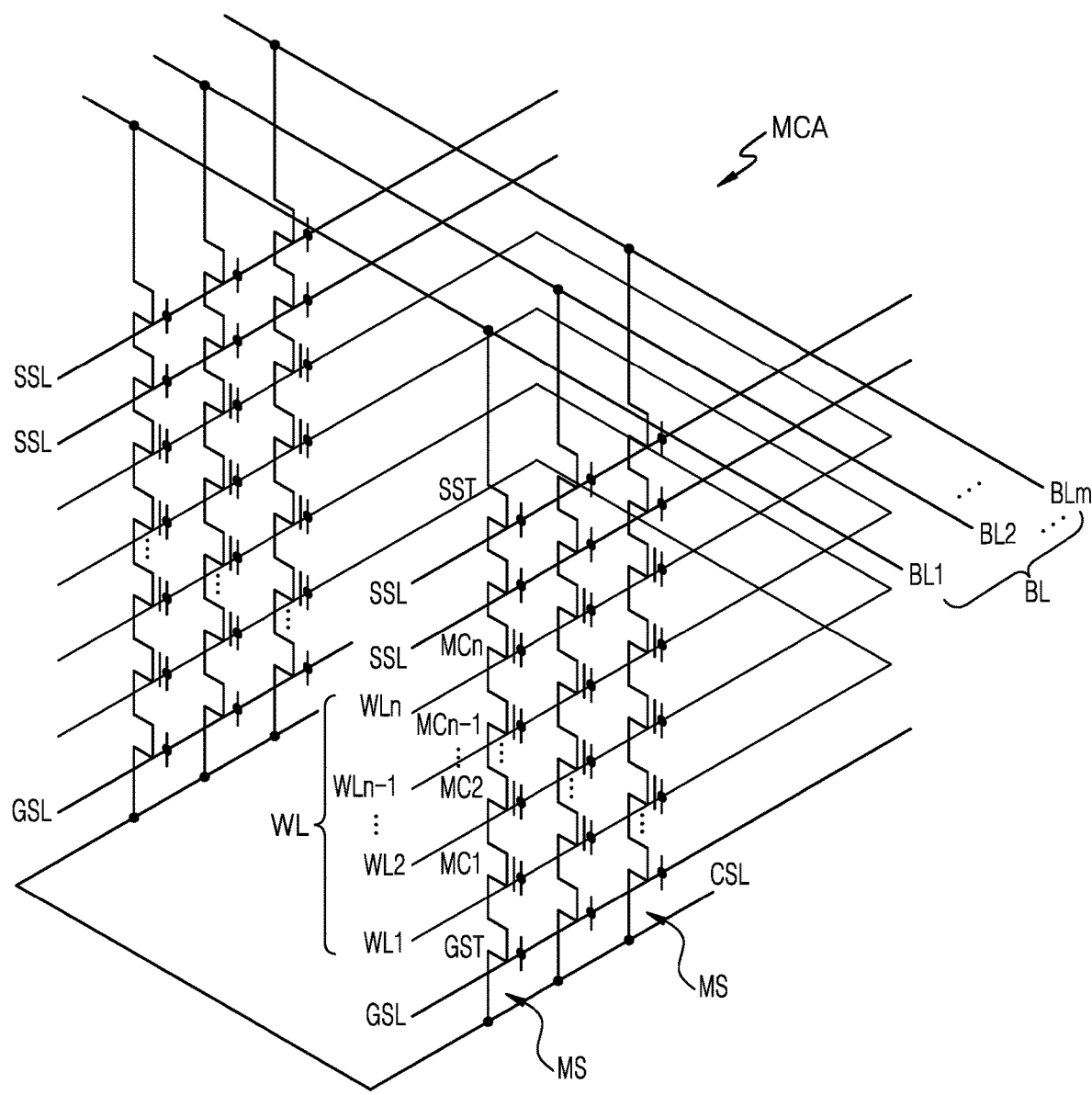
FIG. 3 is an equivalent circuit diagram of a memory cell array of an integrated circuit device according to embodiments of the inventive concept.

FIG. 3 is a partial, equivalent circuit diagram for a memory cell array (MCA) of an integrated circuit device according to embodiments of the inventive concept. In FIG. 3, the equivalent circuit diagram of a vertical NAND flash memory device having a vertical channel structure is presented. Each of the cell blocks BLK1, BLK2, . . . , and BLKn illustrated in FIG. 2 may include a memory cell array (MCA) having a circuit configuration like the one illustrated in FIG. 3.

Referring to FIG. 3, the memory cell array (MCA) may include memory cell strings MS. The memory cell array (MCA) may include bit lines BL1, BL2, . . . , and BLm, word lines WL1, WL2, WLn-1, and WLn, at least one string selection line SSL, at least one ground selection line GSL, and a common source line CSL. The memory cell strings MS may be respectively formed between the bit lines BL1, BL2, . . . , and BLm and the common source line CSL. In the illustrated example of FIG. 3, each of the memory cell strings MS includes two (2) string selection lines SSL. However, the inventive concept is not limited thereto. For example, each of the memory cell strings MS may include only one string selection line SSL.

Each of the memory cell strings MS may include a string selection transistor SST, a ground selection transistor GST, and a plurality of memory cell transistors MC1, MC2, . . . , MCn-1, and MCn ("memory cell transistors"). Drain regions of the string selection transistors SST may be connected to the bit lines BL1, BL2, . . . , and BLm and source regions of the ground selection transistors GST may be connected to the common source line CSL. Source regions of the ground selection transistors GST may be commonly connected to the common source line CSL.

The string selection transistors SST may be connected to the string selection lines SSL and the ground selection transistors GST may be connected to the ground selection lines GSL. The memory cell transistors MC1, MC2, . . . , MCn-1, and MCn may be respectively connected to the word lines WL1, WL2, . . . , WLn-1, and WLn.

Figure 4:
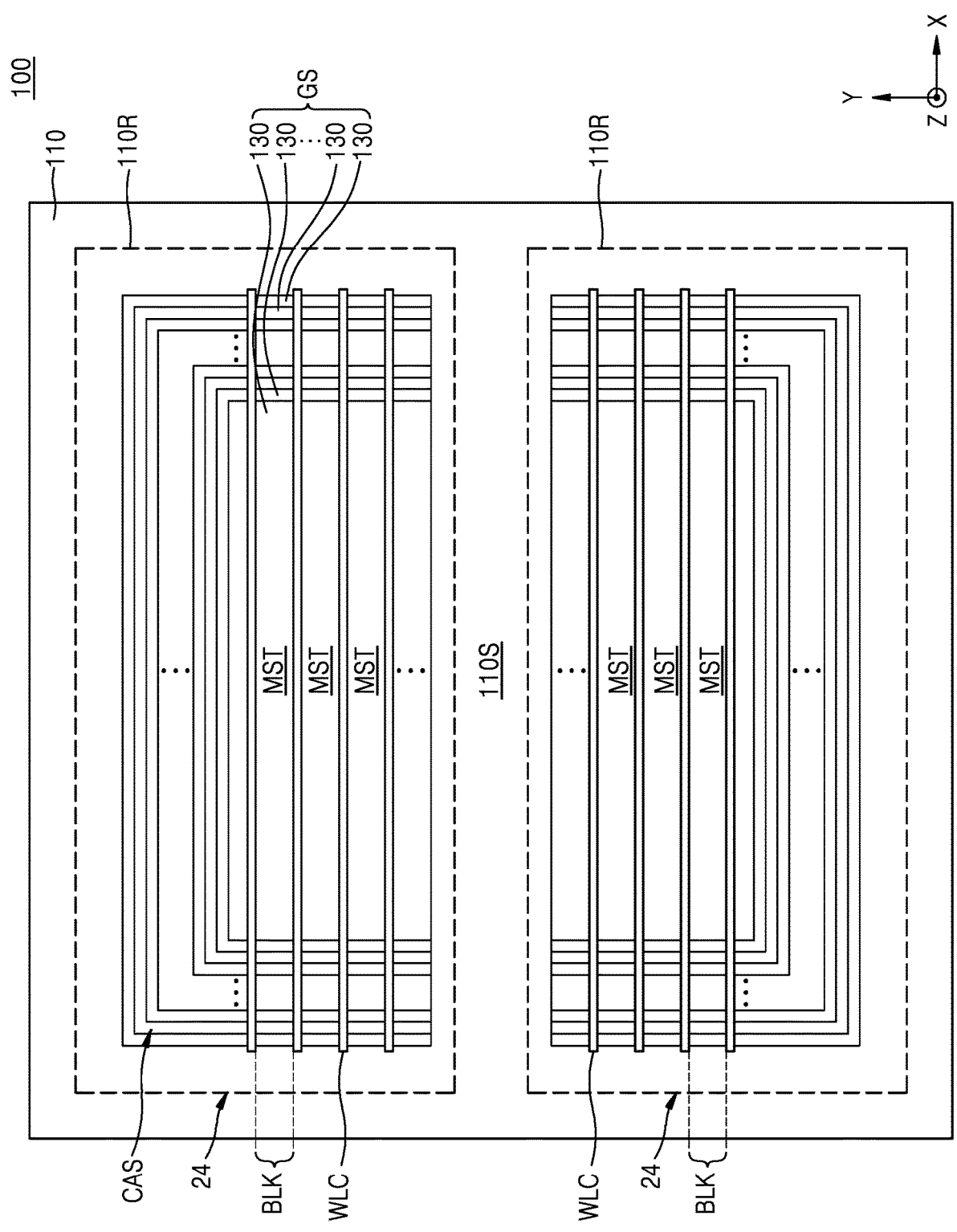
FIG. 4 is a plan view of an integrated circuit device according to embodiments of the inventive concept.

FIG. 4 is a plan view of an integrated circuit device 100 according to embodiments of the inventive concept.

Referring to FIG. 4, the integrated circuit device 100 may include a cell array structure CAS arranged on a conductive plate 110. The conductive plate 110 and the cell array structure CAS may form the memory cell array 20 of the integrated circuit device 10 of FIG. 1. The conductive plate 110 may perform a function of the common source line CSL illustrated in FIG. 3. The conductive plate 110 may support the cell array structure CAS. In the current specification, the term "conductive plate" may be referred to as "a CSL plate" and "the conductive plate" and "the CSL plate" have the same meaning.

The cell array structure CAS may include the tiles 24 described with reference to FIG. 2 and each of the tiles 24 may include multiple cell blocks BLK. Each of the cell blocks BLK that form (or are included in) a tile 24 may have a structure like the that described in relation to FIG. 2. In exemplary embodiments, the conductive plate 110 may provide a path through which a common source voltage may be communicated to the cell array structure CAS.

The conductive plate 110 may include a plurality of tile regions 110R ("tile regions") positioned to correspond with the tiles 24. One tile 24 may be arranged on one tile region 110R of the conductive plate 110. In the conductive plate 110, two adjacent tile regions 110R may be spaced apart from each other using an interposing tile separation region 110S. In other exemplary embodiments, one conductive plate 110 may include only one tile region 110R.

Figure 8:
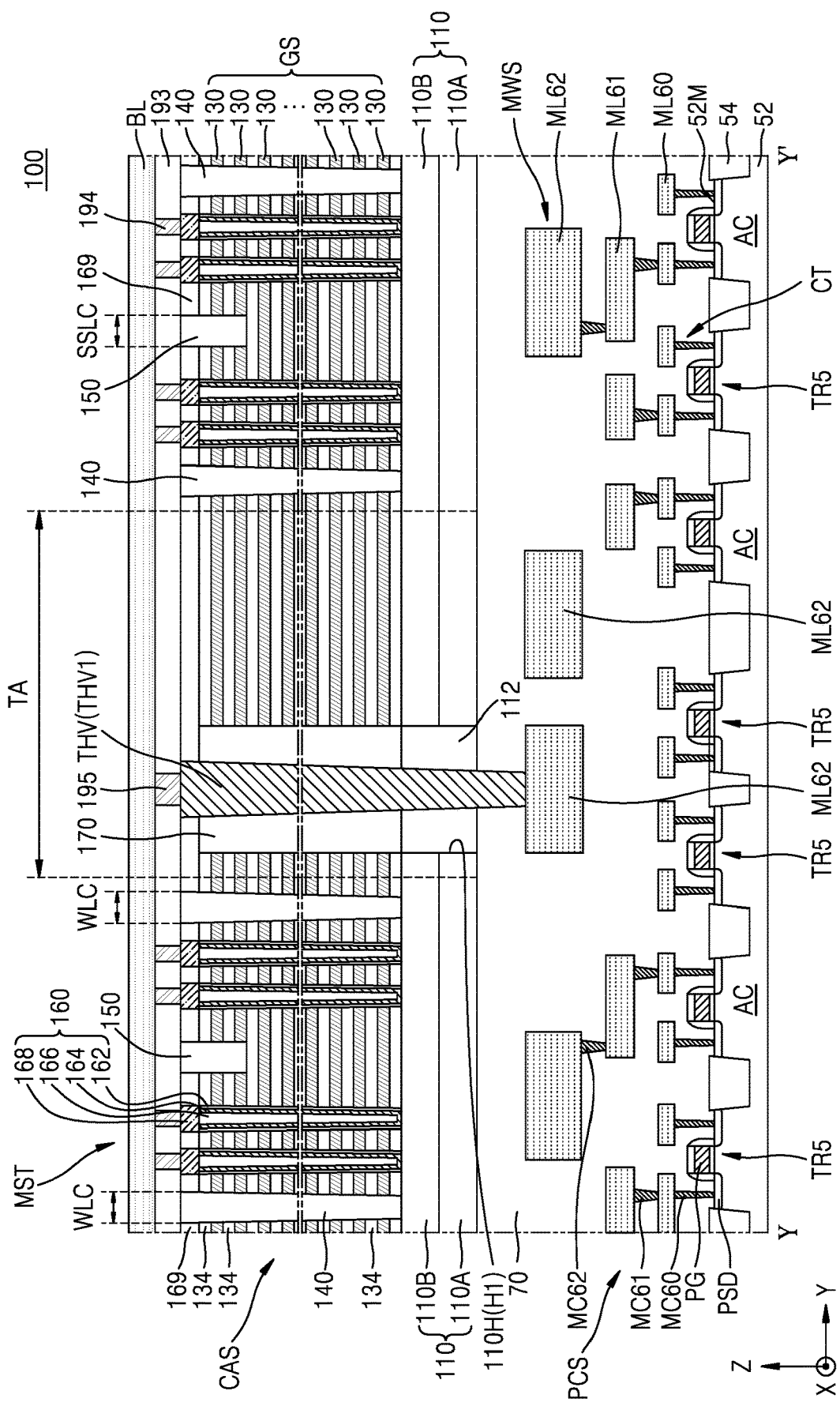
FIG. 8 is a cross-sectional view illustrating enlargements of partial components taken along the line Y-Y' of FIG. 7.

The integrated circuit device 100 may include a peripheral circuit structure PCS like the one referred to FIG. 2 that may be arranged under the cell array structure CAS. The peripheral circuit structure PCS may include the peripheral circuit 30 described in relation to FIG. 1. As illustrated in FIG. 8, the cell array structure CAS may overlap the peripheral circuit structure PCS with the conductive plate 110 interposed in the vertical direction.

In the cell array structure CAS, each of the tiles 24 may include a plurality of gate lines 130 ("gate lines") sequentially stacked on the tile region 110R of the conductive plate 110 in the vertical direction. An area associated with the gate lines 130 on an X-Y plane may be gradually reduced as a distance from the conductive plate 110 increases. In exemplary embodiments, the gate lines 130 may include at least one conductive element, such as tungsten (W), nickel (Ni), cobalt (Co), or tantalum (Ta), metal silicide such as W silicide, Ni silicide, Co silicide, or Ta silicide, doped polysilicon, or a combination of same.

In each of the tiles 24, the gate lines 130 may be divided into the plurality of blocks BLK ("blocks") by a plurality of word line cut regions WLC ("word line cuts") that extend longitudinally in a horizontal direction (an 'X' direction). The gate lines 130 included in each of the blocks BLK may form a gate stack GS. Each of the blocks BLK may include a memory stack MST including one gate stack GS. In each of the memory stacks MST that form one tile 24, the gate lines 130 may form the ground selection line GSL, the word lines WL1, WL2, . . . , WLn-1, and WLn, and the string selection line SSL as described in relation to FIG. 3.

Figure 5:
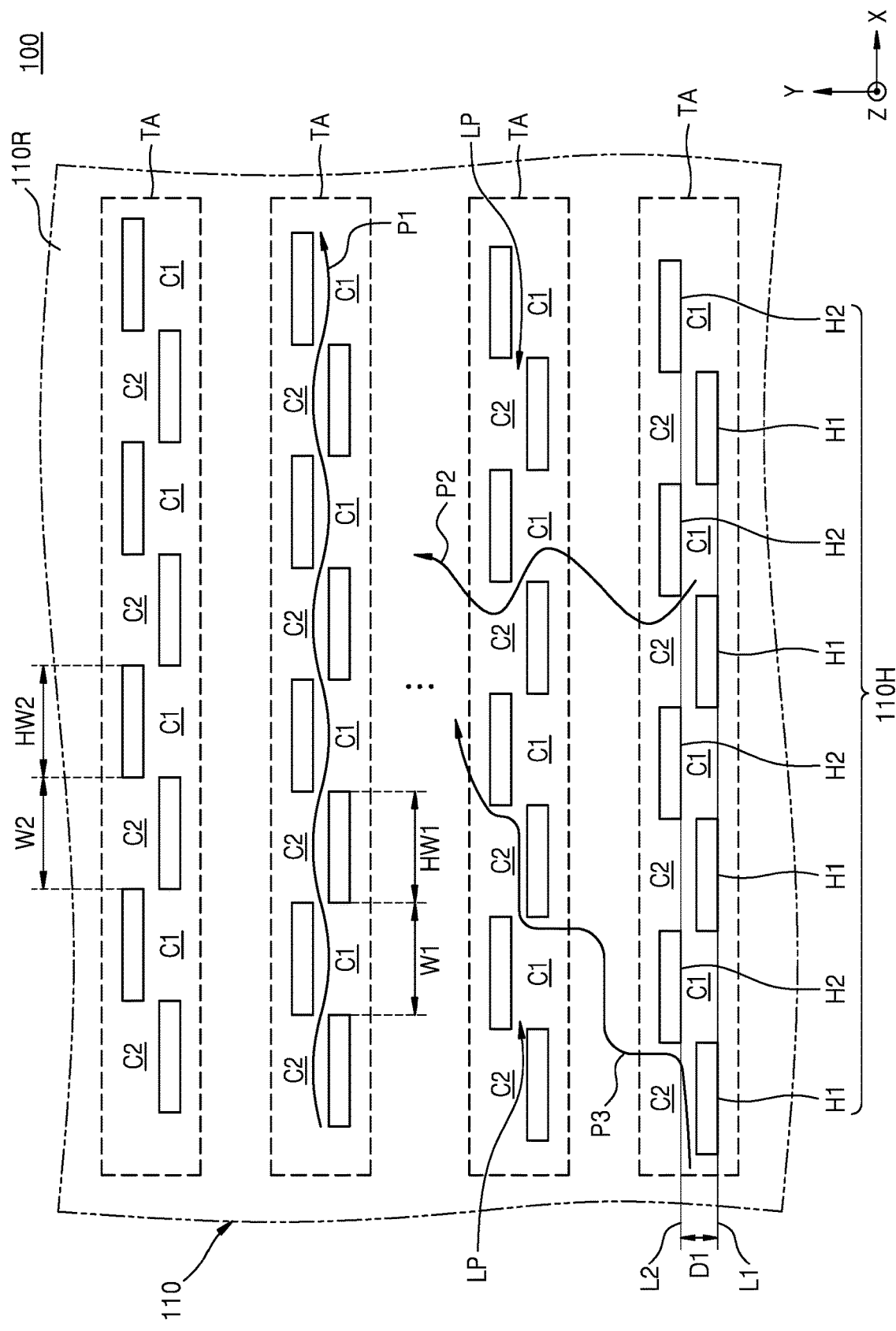
FIG. 5 is an enlarged plan view of a partial region of one tile region in a conductive plate included in an integrated circuit device according to embodiments of the inventive concept.

FIG. 5 is a partial, enlarged plan view of the one tile region 110R in the conductive plate 110 of the integrated circuit device 100 of FIG. 4. However, the configuration described in relation to FIG. 5 may also be applied to each of the tile regions 110R included in the integrated circuit device 100.

Referring to FIG. 5, the tile region 110R of the conductive plate 110 may include a plurality of through electrode regions TA ("through electrode regions"). The through electrode regions TA may longitudinally extend in a first horizontal direction (the X direction) to run parallel with the word line cut regions WLC shown in FIG. 4. In exemplary embodiments, in each of the through electrode regions TA or between adjacent pairs of the through electrode regions TA, at least one word line cut region WLC and at least one memory stack MST may be provided.

In each of the through electrode regions TA, a plurality of through holes 110H ("through holes") may be formed. In one through electrode region TA, the through holes 110H may include first through holes H1 arranged in a straight line along one straight line extending in the first horizontal direction (the X direction), for example, a virtual first straight line L1 and spaced apart from each other and second through holes H2 arranged in a straight line along the other straight line spaced apart from the one straight line in a second horizontal direction (a Y direction), for example, a virtual second straight line L2 and apart from each other. The virtual first straight line L1 and the virtual second straight line L2 may extend in parallel and, in the second horizontal direction (the Y direction), a distance D1 between the virtual first straight line L1 and the virtual second straight line L2 may be greater than a size of each first through hole H1 and each second through holes H2 in the second horizontal direction (the Y direction).

In one through electrode region TA, the first through holes H1 and the second through holes H2 may be offset from each other. The second through holes H2 may be offset from the first through holes H1 in the second horizontal direction (the Y direction). For example, in one through electrode region TA, one first through hole H1 and one second through hole H2 adjacent to each other in the first horizontal direction (the X direction) may be offset from each other without being aligned in a straight line in the second horizontal direction (the Y direction) and a plurality of pairs ("pairs") of first and second through holes H1 and H2 offset from each other in the second horizontal direction (the Y direction) may be arranged in line in the one through electrode region TA in the first horizontal direction (the X direction). That is, in the one through electrode region TA, the one first through hole H1 and the one second through hole H2 are alternately arranged in the first horizontal direction (the X direction) and the first through hole H1 and the second through hole H2 adjacent to each other are offset from each other without being aligned in a straight line in the second horizontal direction (the Y direction).

Each of the first through holes H1 may have a first width HW1 in the first horizontal direction (the X direction) and each of the second through holes H2 may have a second width HW2 in the first horizontal direction (the X direction). In some embodiments, the first width HW1 and the second width HW2 may be equal (or substantially the same). In other embodiments, the first width HW1 and the second width HW2 may be different.

The conductive plate 110 includes a plurality of first conductive regions C1 ("first conductive regions") each with a limited first width W1 in the first horizontal direction (the X direction) by two adjacent first through holes H1 arranged in line along the virtual first straight line L1. In addition, the conductive plate 110 includes a plurality of second conductive regions C2 ("second conductive regions") each with a limited second width W2 in the first horizontal direction (the X direction) by two adjacent second through holes H2 arranged in line along the virtual second straight line L2. In some embodiments, the first width W1 and the second width W2 may be equal (or substantially the same). In other embodiments, the first width W1 and the second width W2 may be different.

One first through hole H1, and one second through hole H2 closest to the one first through hole H1 may be spaced apart from each other in the second horizontal direction (the Y direction).

In the one through electrode region TA, the conductive plate 110 may include a plurality of local regions LP ("local regions") arranged between a selected first through holes and a selected second through holes H2. Each of the local regions LP may be arranged between the selected first through hole H1 and the selected second through hole H2 closest to the selected first through hole HE Each of the local regions LP may have a length greater than 0 in the second horizontal direction (the Y direction). The second through hole H2 closest to the selected first through hole H1 may be spaced apart from the selected first through hole H1 by the local area LP interposing in the second horizontal direction (the Y direction).

The first conductive regions C1 and the second conductive regions C2 may be connected to each other through the local regions LP. In the conductive plate 110, the local regions LP may be limited by the first through holes H1 and the second through holes H2. A zigzag type conductive path may be formed by the local regions LP around a certain point of the conductive plate 110 in a radial direction. For example, a first conductive path P1 that passes through the local regions LP in zigzag around a certain point of the conductive plate 110 in the first horizontal direction (the X direction), a second conductive path P2 that passes through the local regions LP in zigzag in the second horizontal direction (the Y direction), and/or a third conductive path P3 that passes through the local regions LP in zigzag in a diagonal direction between the first horizontal direction (the X direction) and the second horizontal direction (the Y direction) may be formed.

The through electrode regions TA illustrated in FIG. 5 may be arranged in various positions in relation to the tile region 110R of the conductive plate 110. For example, the through electrode regions TA may be arranged between both edge regions of the tile region 110R in the second horizontal direction (the Y direction), or in the center region of the tile region 110R in the second horizontal direction (the Y direction).

Figure 6A:
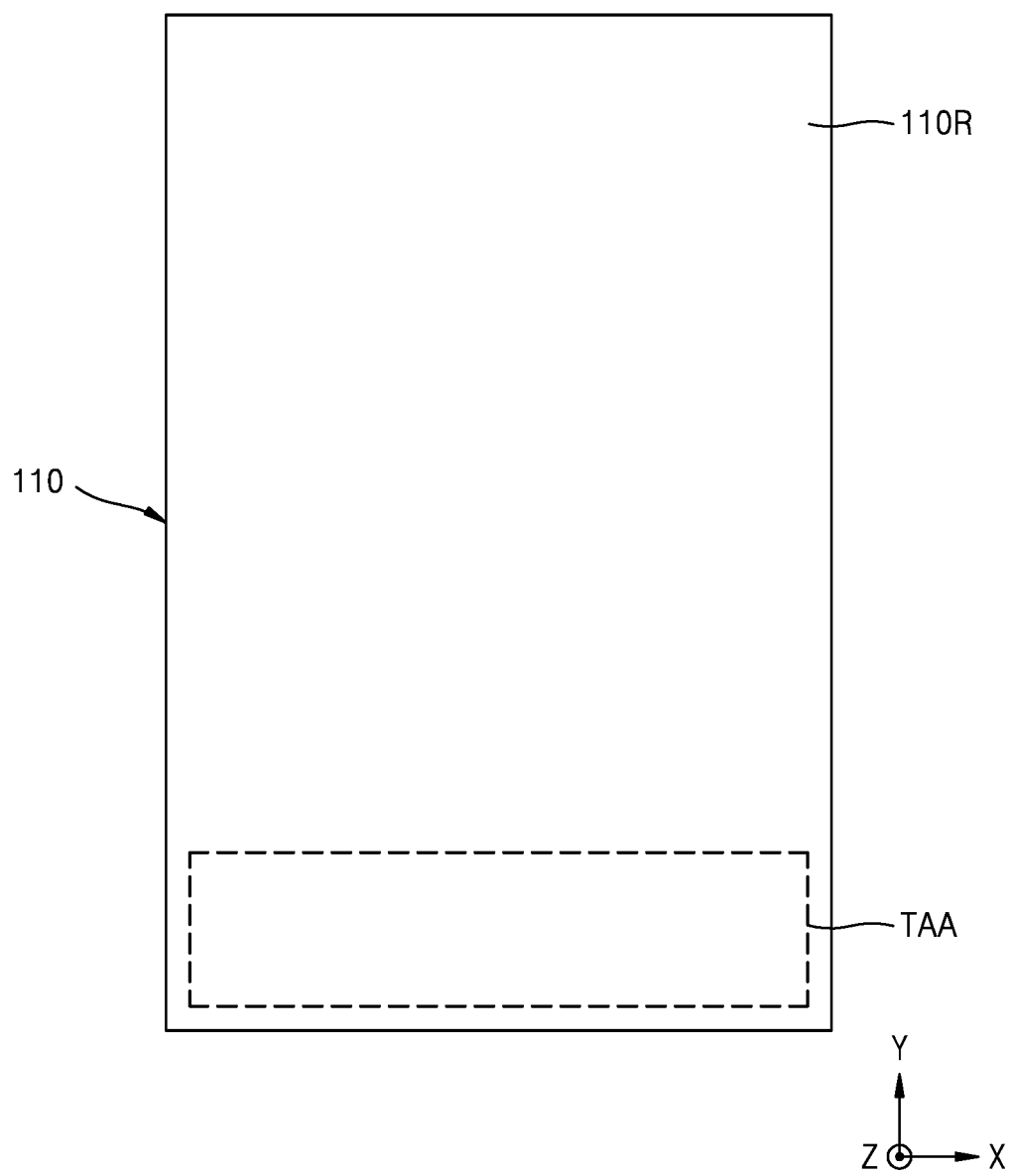
FIGS. 6A, 6B and 6C are respective plan views illustrating through electrode regions arranged in various positions in a tile region of a conductive plate included in an integrated circuit device according to embodiments of the inventive concept.
Figure 6B:
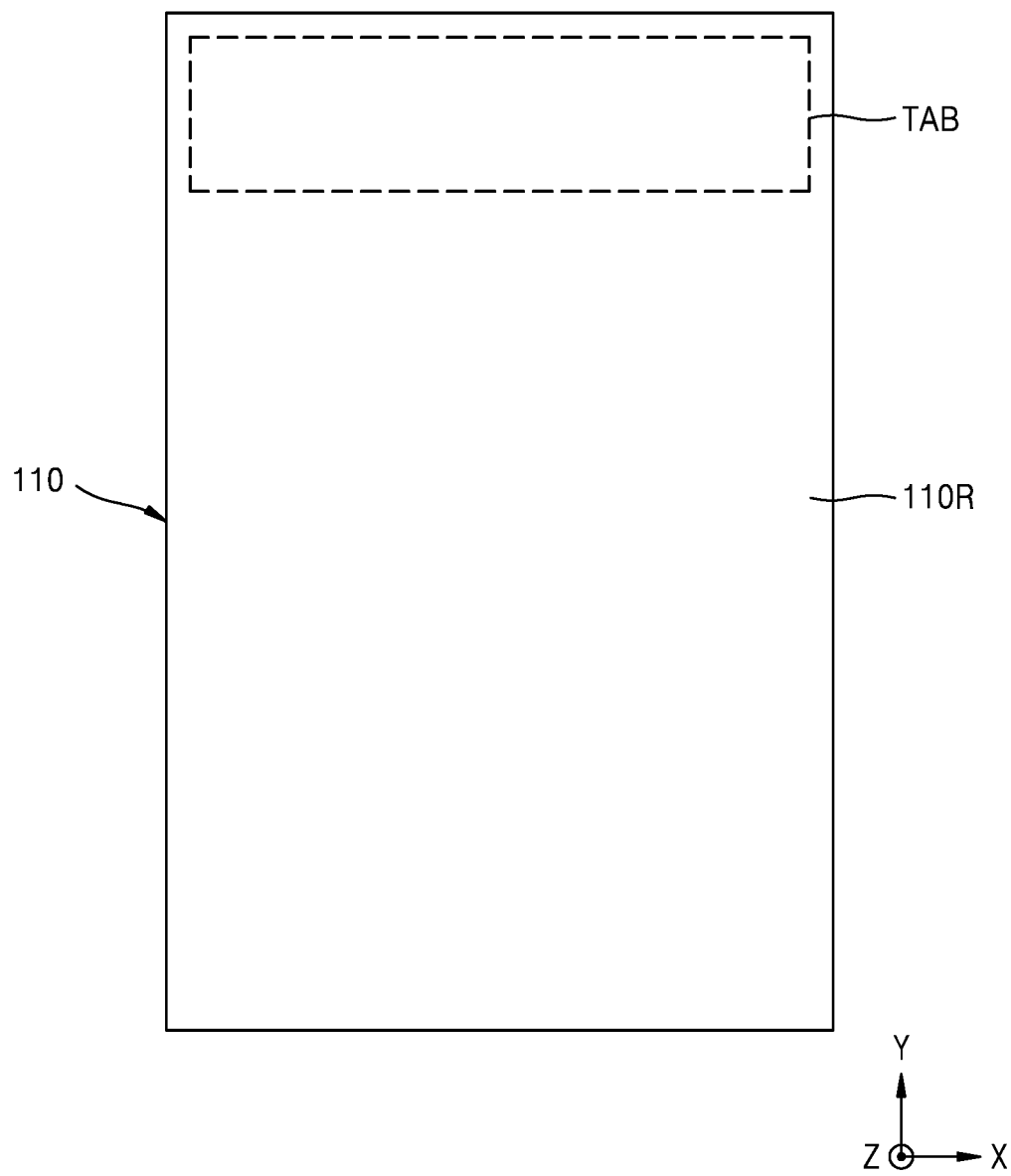
Figure 6C:
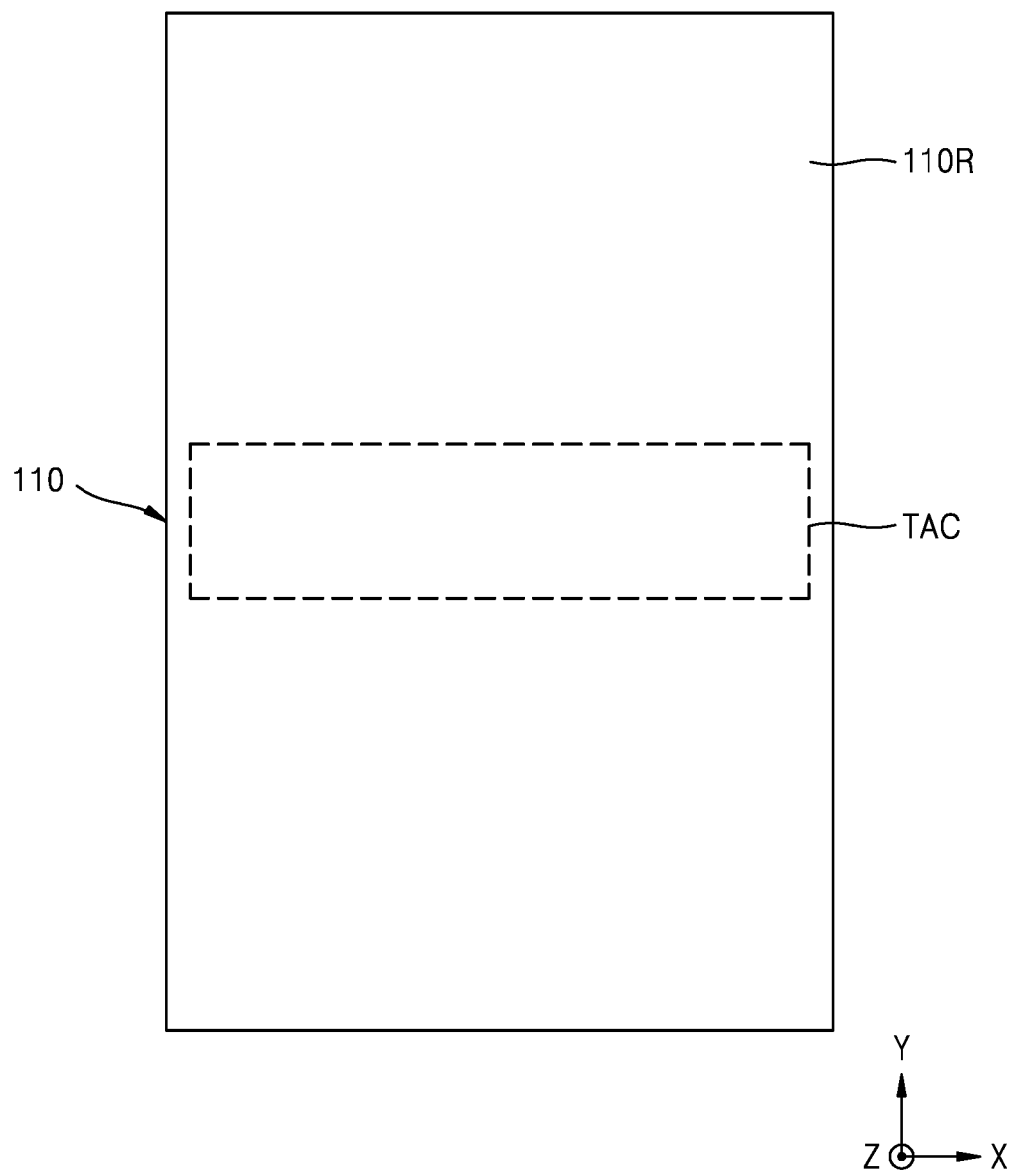

FIGS. 6A, 6B and 6C are respective plan views illustrating possible locations for the through electrode regions TAA, TAB, and TAC in the tile region 110R of the conductive plate 110.

In FIG. 6A, the tile region 110R of the conductive plate 110 may include the through electrode region TAA arranged along one edge region of the tile region 110R in the second horizontal direction (the Y direction). In FIG. 6B, the tile region 110R of the conductive plate 110 may include the through electrode region TAB arranged along another edge region of the tile region 110R in the second horizontal direction (the Y direction), and in FIG. 6C, the tile region 110R of the conductive plate 110 may include the through electrode region TAC arranged in the center region of the tile region 110R in the second horizontal direction (the Y direction). Each of the through electrode regions TAA, TAB, and TAC illustrated in FIGS. 6A, 6B and 6C may include the through electrode regions TA of FIG. 5.

Figure 7:
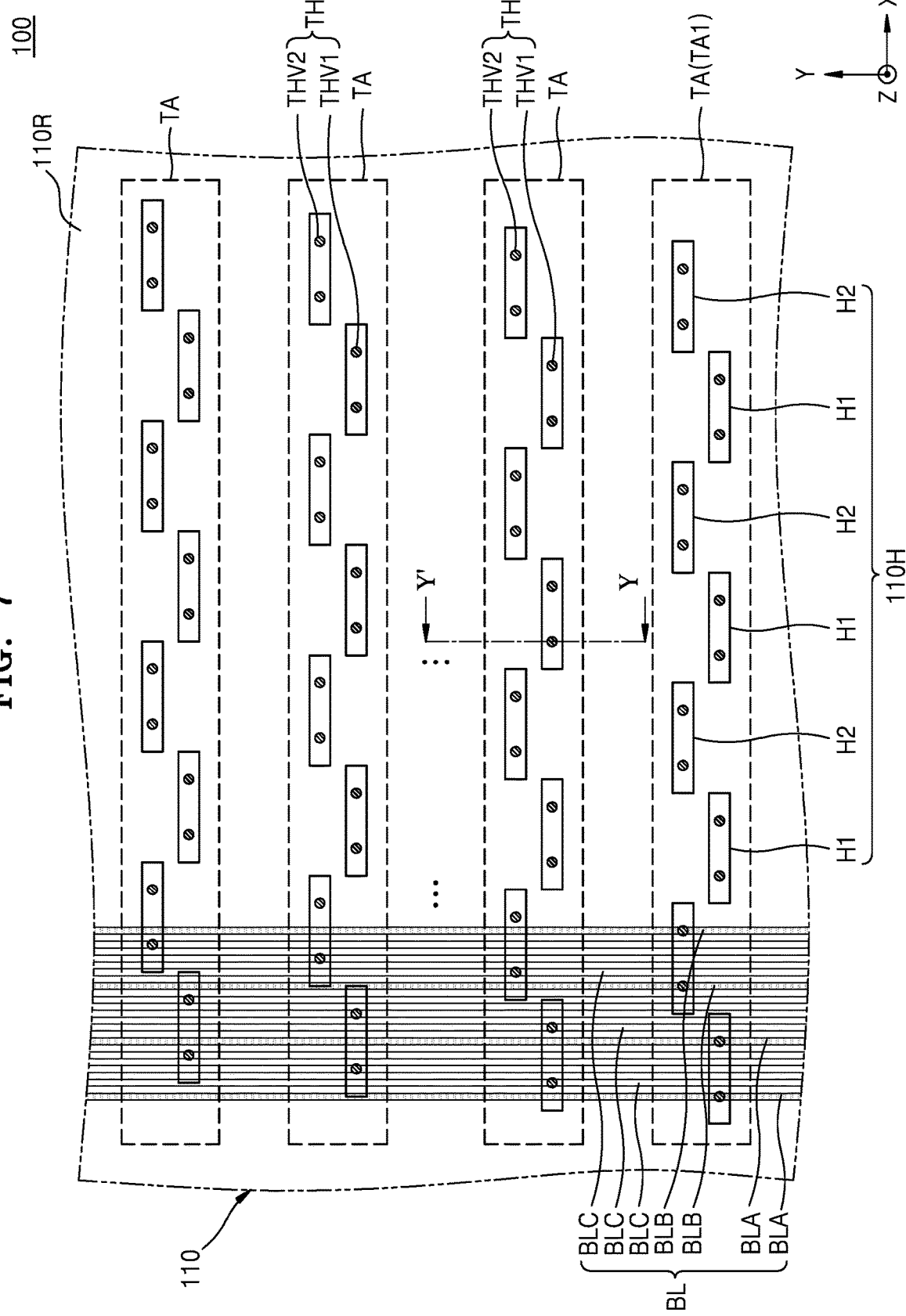
FIG. 7 is a plan view illustrating partial components of the integrated circuit device in order to describe an integrated circuit device according to embodiments of the inventive concept in more detail.

FIG. 7 is a plan view further illustrating certain components of the integrated circuit device 100 of FIGS. 4 and 5. FIG. 8 is a cross-sectional view taken along line Y-Y' of FIG. 7.

Referring to FIGS. 7 and 8, the integrated circuit device 100 includes the peripheral circuit structure PCS and the cell array structure CAS arranged on the peripheral circuit structure PCS and overlapping the peripheral circuit structure PCS in the vertical direction (the Z direction).

The conductive plate 110 is interposed between the peripheral circuit structure PCS and the cell array structure CAS and may perform the function of the common source line CSL illustrated in FIG. 3. In exemplary embodiments, the conductive plate 110 may function as a source region supplying a current to vertical memory cells included in the cell array structure CAS.

In exemplary embodiments, the conductive plate 110 may be formed of a stacked structure of a metal plate 110A and a semiconductor plate 110B. The metal plate 110A may be formed of W and the semiconductor plate 110B may be formed of doped polysilicon. However, the inventive concept is not limited thereto. Each of the first through holes H1 and the second through holes H2 may pass through the stacked structure of a metal plate 110A and a semiconductor plate 110B.

The cell array structure CAS may include the memory stack MST arranged on the conductive plate 110. In an upper portion of each of the through electrode regions TA shown in FIG. 7 and/or in an upper portion of a region between adjacent through electrode regions TA, the memory stack MST with the cross-sectional structure illustrated in FIG. 8 may be provided.

The memory stack MST may include the gate stack GS. The gate stack GS may include gate lines 130 extending in parallel in a horizontal direction and overlapping in the vertical direction (the Z direction). Each of the gate lines 130 may be formed of at least one conductive element, such as a metal, metal silicide, a doped semiconductor, or a combination same. For example, each of the gate lines 130 may include W, Ni, Co, or Ta, metal silicide such as W silicide, Ni silicide, Co silicide, or Ta silicide, doped polysilicon, or a combination of same.

An insulating layer 134 may be interposed between the conductive plate 110 and the plurality of gate lines 130 and between adjacent gate lines 130. An upper surface of an uppermost one of the gate lines 130 may also be covered with the insulating layer 134. The insulating layer 134 may be formed of silicon oxide.

On the conductive plate 110, the word line cut regions WLC may extend longitudinally across the memory stack MST in the first horizontal direction (the X direction). A width of each of the gate lines 130 in the second horizontal direction (the Y direction) may be limited by the word line cut regions WLC. The gate lines 130 may be spaced apart by the word line cut regions WLC at regular intervals and may be repeatedly arranged.

Each of the word line cut regions WLC may be filled with an insulating layer 140. The insulating layer 140 may be formed of silicon oxide, silicon nitride, silicon oxynitride, and/or a low dielectric material. For example, the insulating layer 140 may be formed of a silicon oxide layer, a silicon nitride layer, SiON, SiOCN, SiCN, or a combination of same.

On the conductive plate 110, between two adjacent word line cut regions WLC, the gate lines 130 that form one gate stack GS may be stacked to overlap in the vertical direction (the Z direction). The gate lines 130 that form the one gate stack GS may form the ground selection line GSL, the word lines WL, and the string selection line SSL described in relation to FIG. 3. In the gate lines 130, an upper two gate lines 130 may be separated by the string selection line cut regions SSLC interposed therebetween in the second horizontal direction (the Y direction). The upper two gate lines 130 (as separated by the string selection line cut regions SSLC interposed therebetween) may form the string selection lines SSL described in relation to FIG. 3.

As illustrated in FIG. 8, at least one string selection line cut region SSLC may be formed in one gate stack GS. However, the inventive concept is not limited thereto. For example, at least two string selection line cut regions SSLC may be formed in one gate stack GS. The string selection line cut regions SSLC may be filled with insulating layers 150. Each of the insulating layers 150 may be formed of an oxide layer, a nitride layer, or a combination of the above layers. In exemplary embodiments, at least parts of the string selection line cut regions SSLC may be filled with air gaps.

On the conductive plate 110, a plurality of channel structures 160 ("channel structures") may extend through the gate lines 130 in the vertical direction (the Z direction). The channel structures 160 may be spaced apart at predetermined intervals in the first horizontal direction (the X direction) and the second horizontal direction (the Y direction). Each of the channel structures 160 may include a gate dielectric layer 162, a channel region 164, a buried insulating layer 166, and a drain region 168. The gate dielectric layer 162 may include a tunneling dielectric layer, a charge storage layer, and a blocking dielectric layer sequentially formed from the channel region 164. The channel region 164 may include doped polysilicon or undoped polysilicon. The channel region 164 may be cylindrical. An internal space of the channel region 164 may be filled with the buried insulating layer 166. The buried insulating layer 166 may be formed of an insulating material. For example, the buried insulating layer 166 may be formed of silicon oxide, silicon nitride, silicon oxynitride, or a combination of the above materials. In some embodiments, the buried insulating layer 166 may be omitted. In this case, the channel region 164 may be in the form of a pillar without an internal space. The drain region 168 may be formed of a doped polysilicon layer. The drain regions 168 included in the channel structures 160 may be insulated from each other by an upper insulating layer 169. The upper insulating layer 169 may be formed of an oxide layer, a nitride layer, or a combination of the above layers.

The cell array structure CAS may include normal cell regions and dummy cell regions. In the cell array structure CAS, the number and arrangement of normal cell regions and dummy cell regions may vary by design. Among the channel structures 160, certain channel structures 160 arranged in the normal cell regions may be referred to as normal channel structures and other channel structures 160 arranged in the dummy cell regions may be referred to as dummy channel structures.

Certain bit lines BL may be arranged on the channel structures 160. In FIG. 8, among the bit lines BL, one bit line BL is illustrated. However, on the cell array structure CAS, as illustrated in FIG. 7, the bit lines BL may longitudinally extend in the second horizontal direction (the Y direction) in parallel with each other. The bit lines BL may be spaced apart from the conductive plate 110 by the cell array structure CAS interposed therebetween. Here, the term "bit line" may be referred to as "a conductive line". Each of the channel structures 160 may be connected to one corresponding bit line BL among the bit lines BL through a contact pad 194.

In the tile region 110R of the conductive plate 110, through holes 110H passing through the conductive plate 110 in the through electrode regions TA may be formed. In FIG. 8, one first through hole H1 included in the through holes 110H is illustrated. Each of the through holes 110H may be filled with a buried insulating layer 112. On the through electrode region TA of the conductive plate 110, an insulating structure 170 may be arranged. The insulating structures 170 may extend in the vertical direction (the Z direction) through the plurality of gate lines 130 and a plurality of insulating layers 134. Each of the buried insulating layer 112 and the insulating structure 170 may be formed of a silicon oxide layer.

In the through electrode regions TA, a plurality of through electrodes THV ("through electrodes") may extend through the gate lines 130 of the cell array structure CAS in the vertical direction (the Z direction). Each of the through electrodes THV may longitudinally extend to the inside of the peripheral circuit structure PCS through the gate lines 130 of the cell array structure CAS and one through hole 110H selected from the through holes 110H formed in the conductive plate 110 in the vertical direction (the Z direction). Each of the through electrodes THV may be surrounded by the upper insulating layer 169 and the insulating structure 170 in the cell array structure CAS and may be surrounded by the buried insulating layer 112 in the through hole 110H of the conductive plate 110. Each of the through electrodes THV may include one end connected to one bit line BL selected from the bit lines BL and the other end connected to a circuit CT included in the peripheral circuit structure PCS.

As illustrated in In FIG. 7, two (2) through electrodes THV may pass through one through hole 110H. However, the inventive concept is not limited thereto. The number of through electrodes THV passing through the one through hole 110H and a size of each of the through electrodes THV may vary by design in various embodiments of the inventive concept.

The through electrodes THV may include first through electrodes THV1 passing through the first through holes H1 and second through electrodes THV2 passing through the second through holes H2. In exemplary embodiments, in the first through holes H1 and the second through holes H2, intervals at which the through electrodes THV are spaced apart from each other may be uniform.

The bit lines BL may be connected to one through electrode THV selected from the through electrodes THV. In addition, the through electrodes THV may be connected to one bit line BL selected from the bit lines BL. That is, some bit lines BL selected from the bit lines BL, (e.g., first bit lines BLA of FIG. 7) may be connected to the first through electrodes THV1 passing through the first through hole H1 of a first through electrode region TA1 selected from the through electrode regions TA. Other bit lines BL selected from the bit lines BL (e.g., second bit lines BLB of in FIG. 7) may be connected to the second through electrodes THV2 passing through the second through hole H2 of the first through electrode region TA1.

The bit lines BL may further include third bit lines BLC arranged between each of the first bit lines BLA and each of the second bit lines BLB. The third bit lines BLC may not be connected to the first through electrodes THV1 and the second through electrodes THV2 passing through the first through holes H1 and the second through holes H2 formed in the first through electrode region TA1. The third bit lines BLC may be connected to one selected from the first through electrodes THV1 and the second through electrodes THV2 passing through the first through holes H1 and the second through holes H2 formed in the other through electrode regions TA excluding the first through electrode region TA1 among the through electrode regions TA.

In FIG. 7, some bit lines selected from the bit lines BL (e.g.,) one by one for every four (4) bit lines BL in the first horizontal direction (the X direction), that is, only the first and second bit lines BLA and BLB are connected to the through electrodes THV in the first through electrode region TA1 and the third bit lines BLC that are the remaining bit lines BL excluding the first and second bit lines BLA and BLB among the bit lines BL are not connected to the through electrodes THV in the first through electrode region TA1.

As illustrated in FIG. 7, the number of third bit lines BLC interposed between each of the first bit lines BLA and each of the second bit lines BLB may be three (3). However, the inventive concept is not limited thereto and various modifications and changes may be made. For example, only the bit lines BL selected from the bit lines BL (e.g.,) one by one for every 'N' bit lines BL (where 'N' is an integer ranging from 2 to 4) in the first horizontal direction (the X direction) may be connected to the through electrodes THV in the first through electrode region TAl and the remaining bit lines BL excluding the selected bit lines BL may not be connected to the through electrodes THV in the first through electrode region TA1.

The peripheral circuit structure PCS may include a substrate 52, a plurality of circuits CT ("circuits") formed on a circumference surface 52M of the substrate 52, and a multilayer wiring structure MWS. Each of the through electrodes THV may be connected to at least one circuit CT selected from the circuits CT through the multilayer wiring structure MWS included in the peripheral circuit structure PCS. The circuits CT may include various circuits included in the peripheral circuit 30 described in relation to FIG. 1. In exemplary embodiments, the circuits CT may include the row decoder 32, the page buffer 34, the data I/O circuit 36, and the control logic 38 of FIG. 1. The circuits CT may further include one or more I/O interface(s), a column logic, a voltage generator, a pre-decoder, a temperature sensor, a command decoder, an address decoder, and an amplification circuit. The circuits CT may further include unit elements such as a resistor and a capacitor. In exemplary embodiments, the through electrodes THV may be connected to the page buffer 34 of FIG. 1 among the circuits CT included in the peripheral circuit structure PCS.

The substrate 52 may be formed of one or more semiconductor materials. For example, the substrate 52 may include silicon (Si), germanium (Ge), or SiGe. In the substrate 52, active regions AC may be defined by device isolation layers 54. On the active regions AC, a plurality of transistors TR5 ("transistors") forming, at least in part, the circuits CT may be formed. Each of the transistors TR5 may include a gate PG and source/drain regions PSD formed in the active regions AC at both sides of the gate PG.

The multilayer wiring structure MWS may include multiple, peripheral circuit wiring layers ML60, ML61, and ML62 connected to the circuits CT and a plurality of peripheral circuit contacts MC60, MC61, and MC62 ("peripheral circuit contacts"). At least some of the peripheral circuit wiring layers ML60, ML61, and ML62 may be electrically connected to the transistors TR5. The peripheral circuit contacts MC60, MC61, and MC62 may be formed such that the transistors TR5 are connected to at least one of the peripheral circuit wiring layers ML60, ML61, and ML62. A lower end of each of the through electrodes THV may be connected to one of the peripheral circuit wiring layers ML60, ML61, and ML62. For example, the lower end of each of the through electrodes THV may be connected to the uppermost peripheral circuit wiring layer ML62 closest to the cell array structure CAS among the peripheral circuit wiring layers ML60, ML61, and ML62.

Each of the peripheral circuit wiring layers ML60, ML61, and ML62 and the peripheral circuit wiring layers ML60, ML61, and ML62 may be formed of metal, conductive metal nitride, metal silicide, or a combination of same. For example, each of the peripheral circuit wiring layers ML60, ML61, and ML62 and the peripheral circuit wiring layers ML60, ML61, and ML62 may include one or more conductive material(s), such as W, molybdenum (Mo), titanium (Ti), Co, Ta, Ni, W silicide, Ti silicide, Co silicide, Ta silicide, or Ni silicide.

As illustrated in FIG. 8, the multilayer wiring structure MWS may include three (3) wiring layers arranged in the vertical direction (the Z direction). However, the inventive concept is not limited thereto. For example, the multilayer wiring structure MWS may include between two (2) and four (4) wiring layers.

The circuits CT, the peripheral circuit wiring layers ML60, ML61, and ML62, and the peripheral circuit contacts MC60, MC61, and MC62 may be covered with an interlayer insulating layer 70. The through electrodes THV may contact an upper surface of the peripheral circuit wiring layer ML62 through the interlayer insulating layer 70. The interlayer insulating layer 70 may include silicon oxide, SiON, and SiOCN.

The integrated circuit device 100 described with reference to FIGS. 4, 5, 6A, 6B, 6C 7 and 8 (hereafter, "FIGS. 4 to 8") may include the conductive plate 110 with the tile region 110R in which the through holes 110H are formed and the through holes 110H include the first through holes H1 arranged in a straight line along one straight line and spaced apart from each other so as to limit the first conductive regions C1 in the tile region 110R, the second through holes H2 arranged in a straight line along the other straight line and spaced apart from each other so as to limit the second conductive regions C2, and the local regions LP between the first through holes H1 and the second through holes H2. In the one tile region 110R, the first conductive regions C1 and the second conductive regions C2 may be connected to each other through the local regions LP. Therefore, in relation to the local regions LP, around one point of the conductive plate 110, in the radial direction, a zigzag type conductive path may be formed. Therefore, in the integrated circuit device 100, in the conductive plate 110, a cell current may uniformly and smoothly flow in all positions of the tile region 110R so that the cell current may be smoothly dispersed in the conductive plate 110 and noise may be suppressed in the conductive plate 110.

Figure 9A:
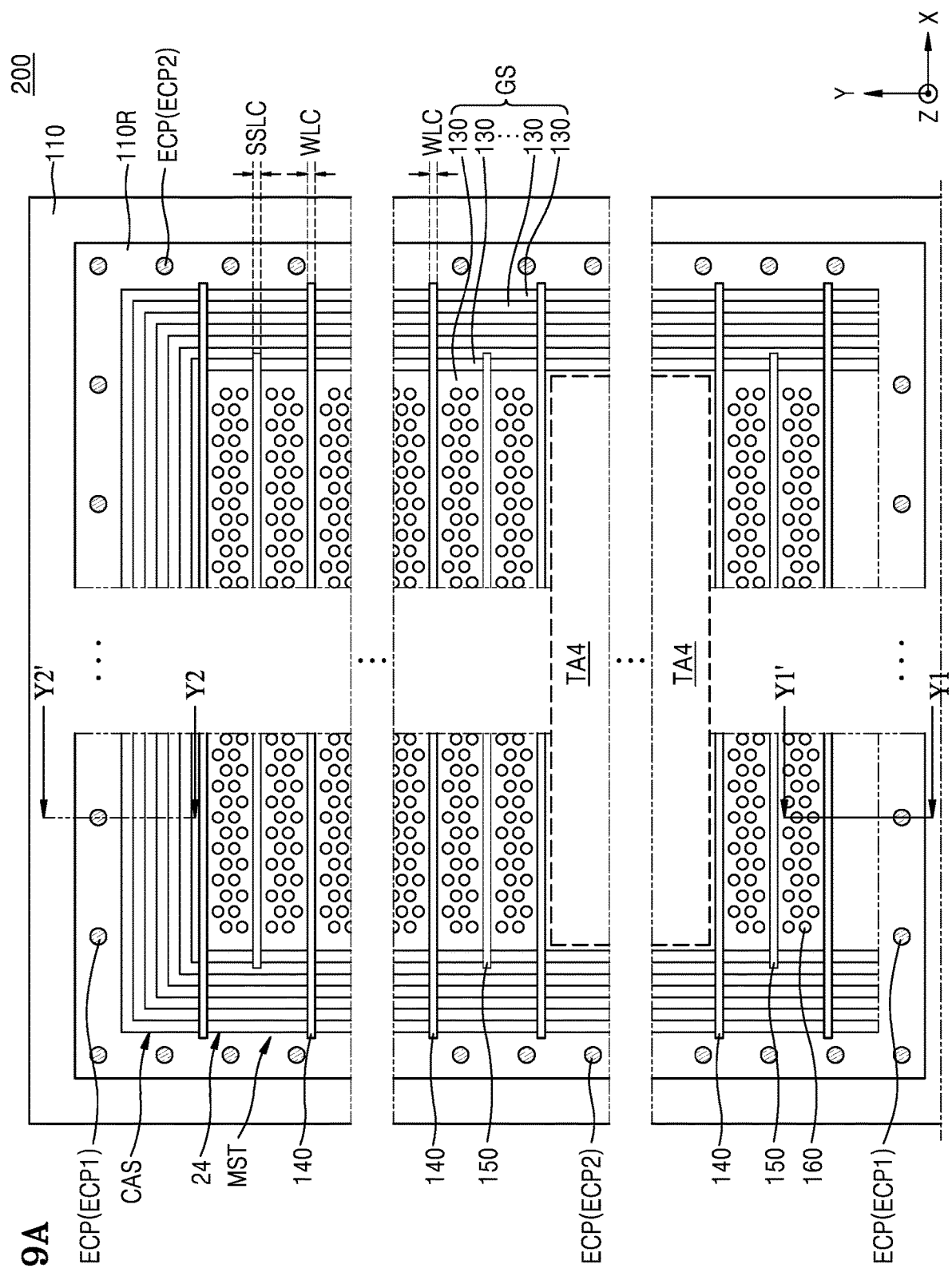
FIGS. 9A, 9B and 9C are respective views illustrating an integrated circuit device according to other embodiments of the inventive concept, where
Figure 9B:
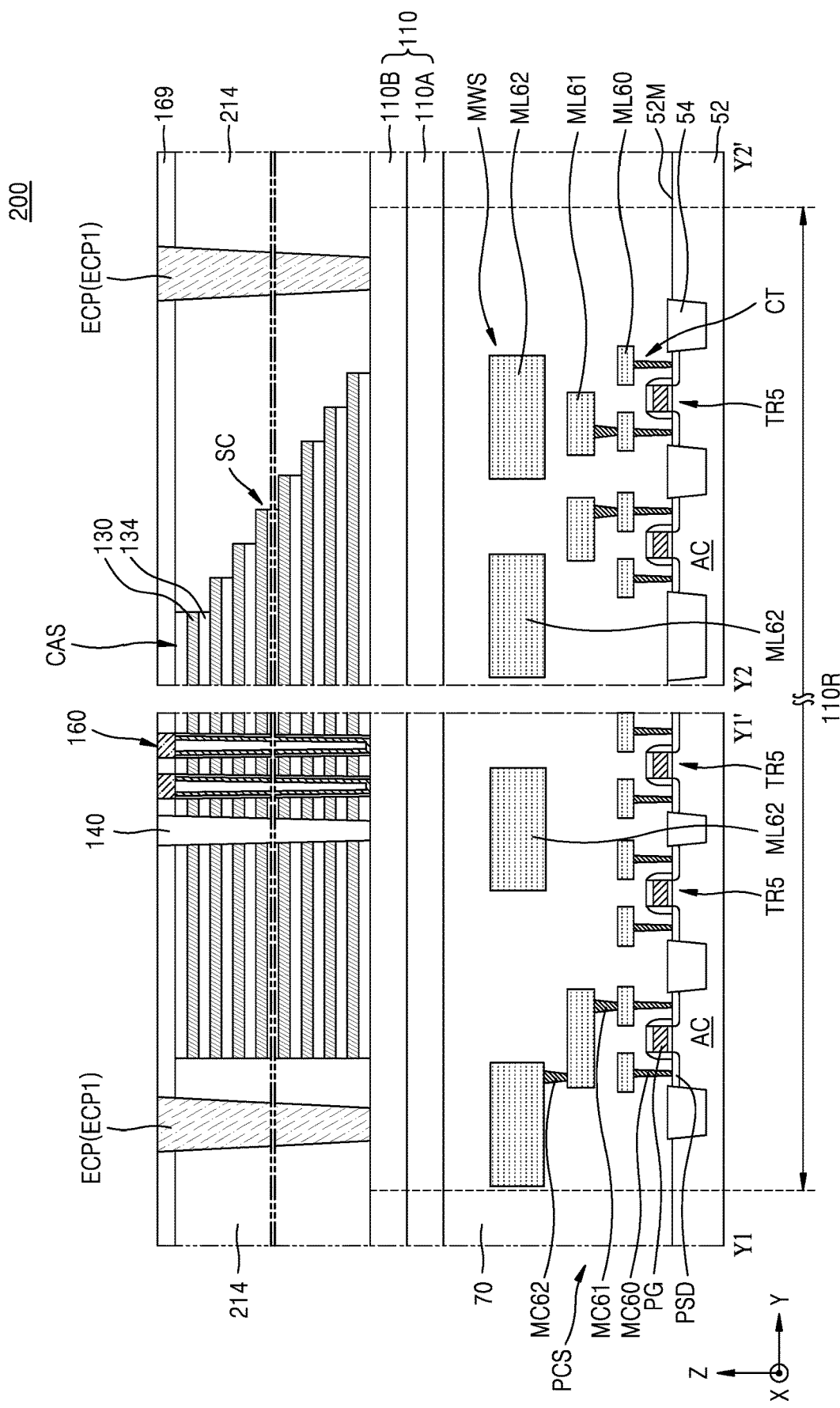
Figure 9C:
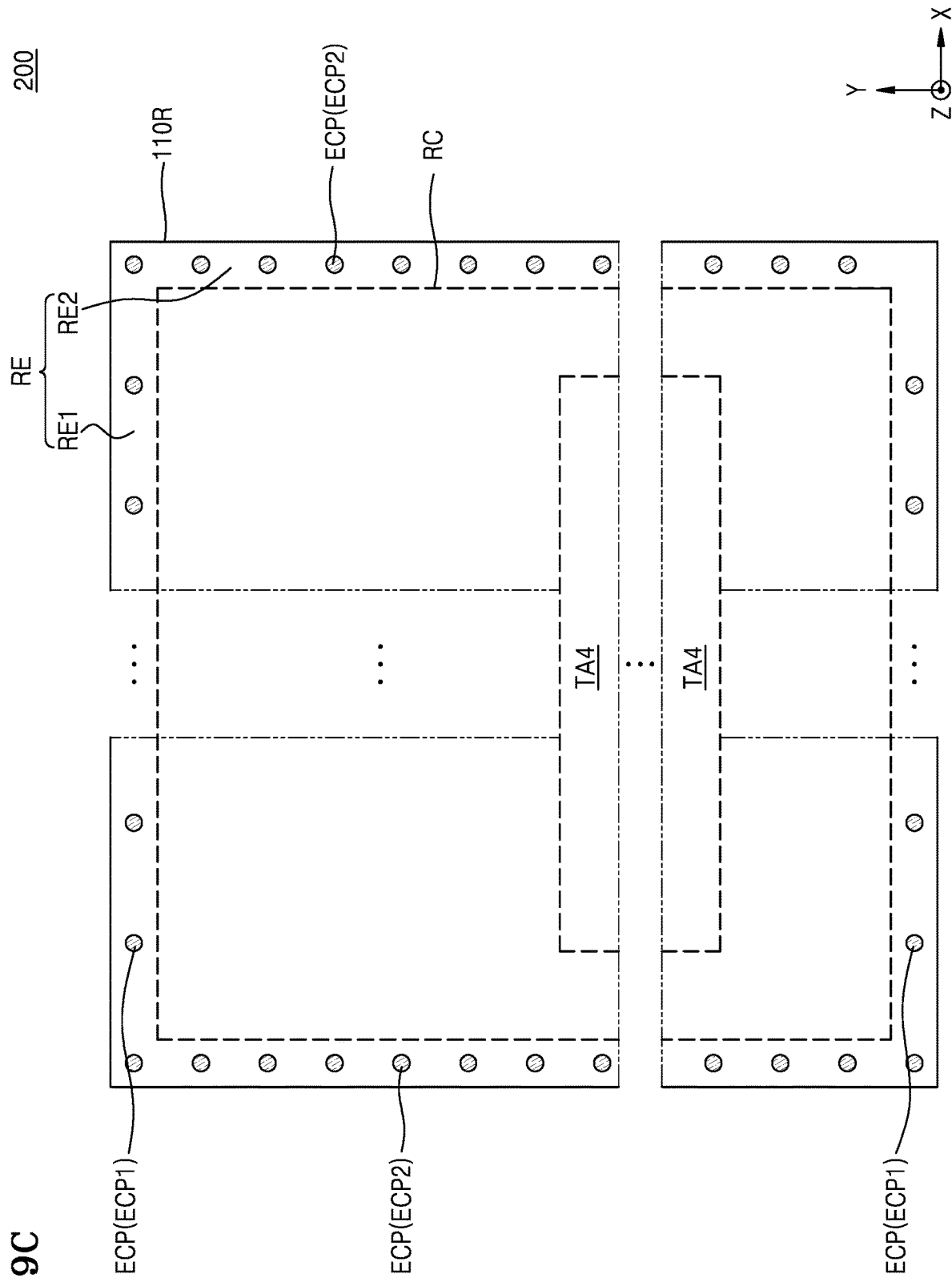

FIGS. 9A, 9B and 9C are related views illustrating an integrated circuit device according to embodiments of the inventive concept. FIG. 9A is a partial, plan view illustrating components of an integrated circuit device 200. FIG. 9B is a cross-sectional view taken along lines Y1-Y1' and Y2-Y2' of FIG. 9A, and FIG. 9C is another, partial, plan view further illustrating components of the integrated circuit device 200 of FIG. 9A.

Referring collectively to FIGS. 9A, 9B and 9C, the integrated circuit device 200 may have the same configuration as that of the integrated circuit device 100 described in relation to FIGS. 4 to 8. The conductive plate 110 includes a through electrode region TA4 arranged in a partial region of the tile region 110R of the conductive plate 110. The through electrode region TA4 may include the through electrode regions TA of FIGS. 5 and 7. The integrated circuit device 200 further includes a plurality of external contact plugs ECP ("external contact plugs") arranged in an edge region RE surrounding the cell array structure CAS including the memory stacks MST in the tile region 110R of the conductive plate 110 and applying a bias to the conductive plate 110. In FIGS. 9A, 9B and 9C, one tile region 110R included in the conductive plate 110 is illustrated. However, in the current example, the configuration of the one tile region 110R may also be applied to the plurality of tile regions 110R included in the integrated circuit device 200.

In the cell array structure CAS formed on the one tile region 110R, in both ends in the second horizontal direction (the Y direction), one end includes a stepped connection SC formed of the gate lines 130 and, in the other end, the stepped connection SC is not included and side walls of each of the gate lines 130 may extend along one plane approximately in a vertical direction. In the cell array structure CAS formed on the one tile region 110R, each of both ends in the first horizontal direction (the X direction) may include the stepped connection SC formed of the gate lines 130.

On the tile region 110R, an insulating layer 214 covering the conductive plate 110 around the cell array structure CAS may be formed. Each of the external contact plugs ECP may longitudinally extend through the insulating layer 214 in the vertical direction (the Z direction) and may have a bottom surface contacting an upper surface of the conductive plate 110. Each of the external contact plugs ECP may be arranged to vertically overlap the peripheral circuit structure PCS. The external contact plugs ECP do not pass through the conductive plate 110. Therefore, the external contact plugs ECP may not be connected to the multilayer wiring structure MWS and the circuits CT included in the peripheral circuit structure PCS.

Each of the external contact plugs ECP may be formed of one or more conductive materials including, W, Ti, Ta, copper (Cu), aluminum (Al), Ti nitride, Ta nitride, W nitride, or a combination of the same. The insulating layer 214 may include silicon oxide, SiON, and SiOCN.

The external contact plugs ECP may include first external contact plugs ECP1 arranged in line in a first edge region RE1 longitudinally extending in the first horizontal direction (the X direction) in the edge region RE of the tile region 110R in the first horizontal direction (the X direction), and second external contact plugs ECP2 arranged in line in a second edge region RE2 longitudinally extending in the second horizontal direction (the Y direction) in the edge region RE of the tile region 110R in the second horizontal direction (the Y direction).

In exemplary embodiments, the first external contact plugs ECP1 may be arranged in the first edge region RE1 in the first horizontal direction (the X direction) at regular intervals and the second external contact plugs ECP2 may be arranged in the second edge region RE2 in the second horizontal direction (the Y direction) at regular intervals. In a plan view, the size and/or shape of the first external contact plugs ECP1 may be different from the size and/or shape of the second external contact plugs ECP2. For example, in the plan view, the size of the first external contact plugs ECP1 may be greater than the size of the second external contact plugs ECP2. However, the inventive concept is not limited thereto.

Intervals at which the first external contact plugs ECP1 are spaced apart from each other may be different from intervals at which the second external contact plugs ECP2 are spaced apart from each other. For example, the intervals at which the first external contact plugs ECP1 are spaced apart from each other may be greater than the intervals at which the second external contact plugs ECP2 are spaced apart from each other. However, the inventive concept is not limited thereto.

In exemplary embodiments, an area (or region) occupied by the second external contact plugs ECP2 may be greater than an area (or region) occupied by the first external contact plugs ECP1.

In the tile region 110R of the conductive plate 110, the external contact plugs ECP may not be arranged on a center region RC surrounded by the edge region RE. Instead, the cell array structure CAS may be arranged in the center region RC of the conductive plate 110.

Figure 10:
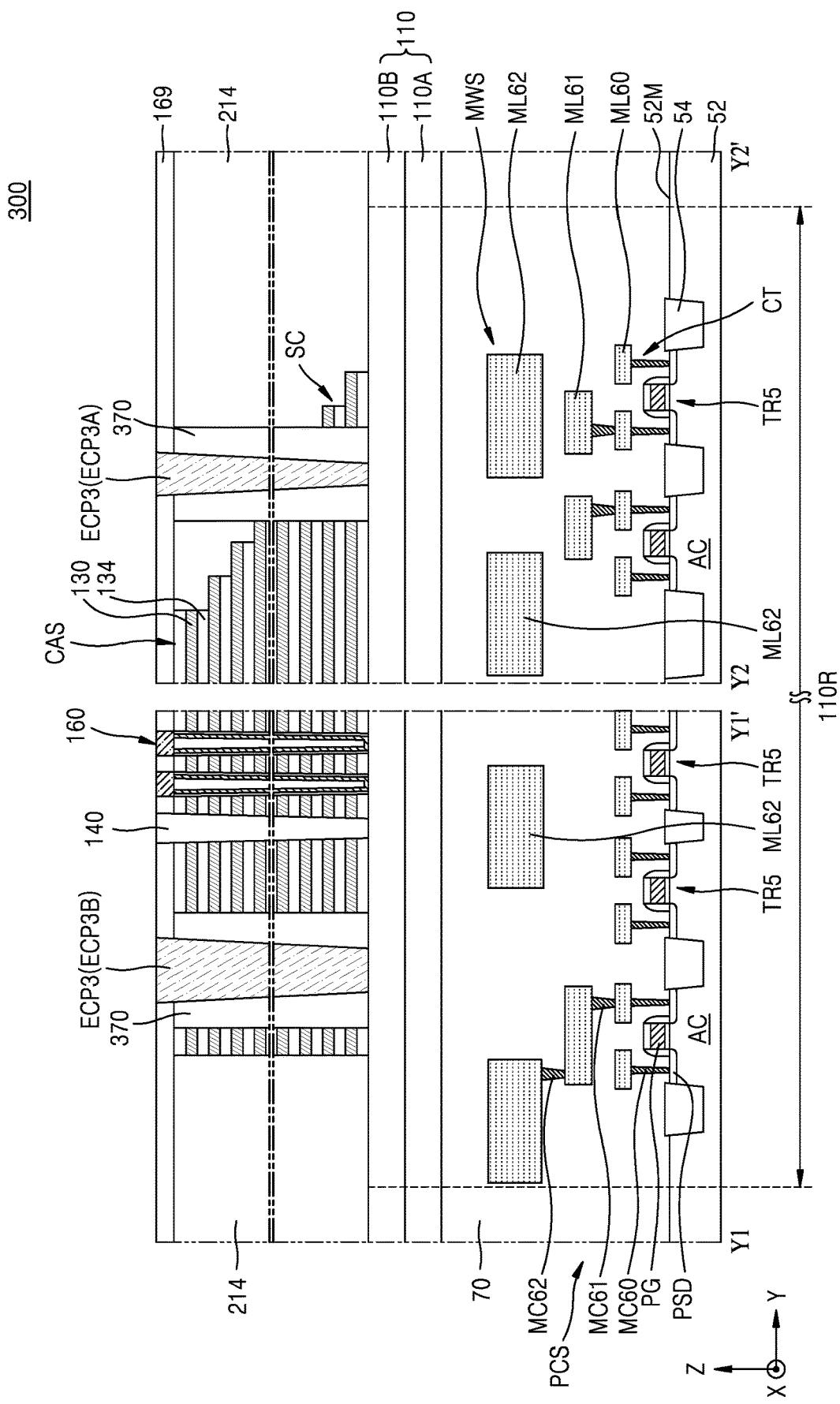
FIG. 10 is a cross-sectional view illustrating an integrated circuit device according to other embodiments of the inventive concept.

FIG. 10 is a cross-sectional view illustrating an integrated circuit device 300 according to other embodiments of the inventive concept. In FIG. 10, some components of regions taken along the lines Y1-Y1' and Y2-Y2' of FIG. 9A are illustrated.

Referring to FIG. 10, the integrated circuit device 300 may have the same configuration as the integrated circuit device 200 described in relation to FIGS. 9A, 9B and 9C. The integrated circuit device 300 may include the external contact plugs ECP3 instead of the external contact plugs ECP previously described. The external contact plugs ECP3 may be arranged to pass through at least a part of the cell array structure CAS. In this regard, each of the external contact plugs ECP3 may be surrounded by an insulating structure 370. The insulating structure 370 may longitudinally extend through a part of the cell array structure CAS and a part of the insulating layer 214 in the vertical direction (the Z direction). The insulating structure 370 may be formed of a silicon oxide layer.

The external contact plugs ECP3 may include first external contact plugs ECP3A and second external contact plugs ECP3B having different horizontal widths. In exemplary embodiments, the width of each second external contact plugs ECP3B may be greater than that of each first external contact plugs ECP3A.

In the integrated circuit device 300, the tile region 110R of the conductive plate 110 may include the edge region RE and the center region RC surrounded by the edge region RE, as illustrated in FIG. 9C. Each of the first external contact plugs ECP3A may extend from the first edge region RE1 adjacent to one end of the tile region 110R in the second horizontal direction (the Y direction) through the stepped connection SC formed of the plurality of gate lines 130 of the cell array structure CAS in the vertical direction (the Z direction). Each of the second external contact plugs ECP3B may extend from the first edge region RE1 adjacent to the other end of the tile region 110R in the second horizontal direction (the Y direction) through the plurality of gate lines 130 of the cell array structure CAS in the vertical direction (the Z direction).

Otherwise, each of the external contact plugs ECP3 may be generally the same as the external contact plugs ECP described in relation to FIGS. 9A, 9B and 9C.

The integrated circuit device 200 described in relation to FIGS. 9A, 9B and 9C and the integrated circuit device 300 described in relation to FIG. 10 include the conductive plate 110 with the tile region 110R in which the through holes 110H limiting the first conductive regions C1 and the second conductive regions C2 are formed as described in the integrated circuit device 100 with reference to FIGS. 4 to 8. In the tile region 110R, the first conductive regions C1 may be connected to the second conductive regions C2 through the local regions LP. Therefore, the zigzag type conductive path may be formed by the local regions LP around a certain point of the conductive plate 110 in a radial direction. Therefore, in the conductive plate 110, the cell current may be smoothly dispersed in all the positions of the tile region 110R so that increase in noise may be suppressed in the conductive plate 110.

In addition, the integrated circuit device 200 described in relation to FIGS. 9A, 9B and 9C and the integrated circuit device 300 described in relation to FIG. 10 may alternately or additionally include the external contact plugs ECP and/or ECP3 each arranged in the edge region RE surrounding the cell array structure CAS including the memory stacks MST in the tile region 110R of the conductive plate 110 and applying the bias to the conductive plate 110. Therefore, it is possible to suppress noise generation and noise skews between the center portion and the edge portion in each of the cell blocks BLK1, BLK2, . . . , and BLKn of the cell array structure CAS formed on the tile region 110R of the conductive plate 110 and the cell current is more smoothly dispersed in the conductive plate 110 by the external contact plugs ECP and ECP3 so that effect of suppression of noise in the conductive plate 110 may improve.

Figure 11:
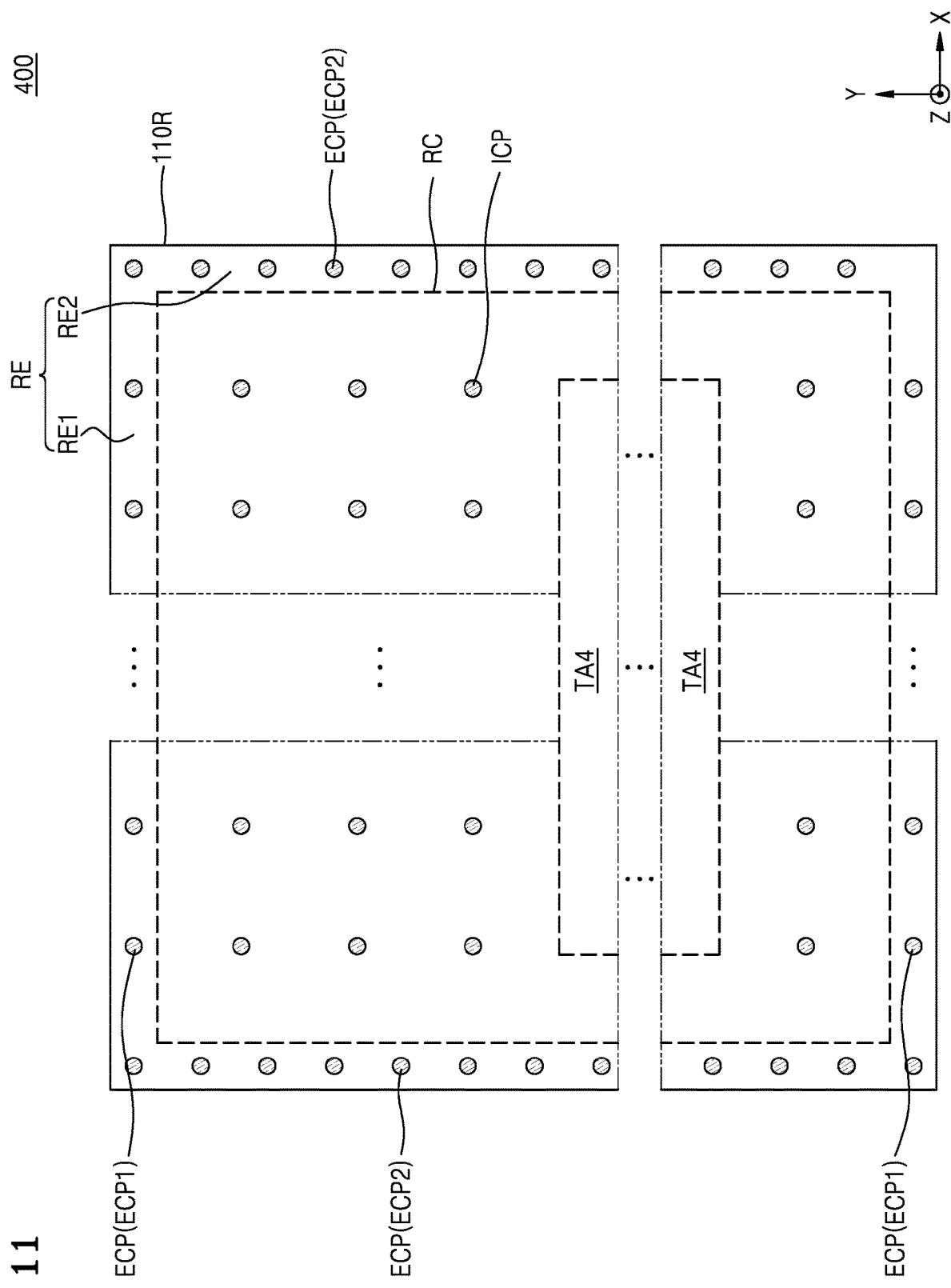
FIG. 11 is a plan view illustrating an integrated circuit device according to other embodiments of the inventive concept.

FIG. 11 is a plan view illustrating an integrated circuit device 400 according to embodiments of the inventive concept. (Compare FIG. 9C).

Referring to FIG. 11, the integrated circuit device 400 may generally have the same configuration as the integrated circuit device 200 of FIGS. 9A, 9B and 9C. However, the integrated circuit device 400 may further includes a plurality of internal contact plugs ICP ("internal contact plugs") connected to the conductive plate 110 through the cell array structure CAS (refer to FIG. 9A) including the memory stacks MST on the center region RC of the tile region 110R and applying the bias to the conductive plate 110.

In exemplary embodiments, the internal contact plugs ICP may be spaced apart from each other at regular intervals. As illustrated in FIG. 11, the internal contact plugs ICP may be arranged in a matrix. However, the inventive concept is not limited thereto. For example, the internal contact plugs ICP may be arranged in a hexagonal array structure.

In exemplary embodiments, the internal contact plugs ICP may be distributed at a density that varies in accordance with a position of the conductive plate 110 in the center region RC of the tile region 110R. In exemplary embodiments, each of the internal contact plugs ICP may have a density that varies in accordance with a distance from the through electrode regions TA of FIG. 7. For example, in portions adjacent to the through electrode regions TA of FIG. 7, the densities of the internal contact plugs ICP may be relatively high and, in regions spaced apart from the through electrode regions TA, the densities of the internal contact plugs ICP may be relatively low.

In the integrated circuit device 400 described in relation to FIG. 11, like the integrated circuit device 100 described in relation to FIGS. 4 to 8, in the conductive plate 110, the cell current may be smoothly dispersed in all the positions of the tile region 110R so that noise may be suppressed in the conductive plate 110. In addition, by the external contact plugs ECP and the internal contact plugs ICP arranged in the edge region RE and the center region RC surrounding the memory stack MST in the tile region 110R of the conductive plate 110, in the cell blocks BLK1, BLK2, . . . , and BLKn of the cell array structure CAS formed on the tile region 110R of the conductive plate 110, skew between a center portion and an edge portion may be suppressed and the cell current may be more smoothly dispersed in the conductive plate 110 so that the effect of noise suppression in the conductive plate 110 may improve.

FIGS. 12A, 12B, 12C, 12D and 12E (hereafter, FIGS. 12A to 12E) are cross-sectional views illustrating in one example a method of manufacturing an integrated circuit device according to embodiments of the inventive concept. In FIGS. 12A to 12E, some components taken along the line Y-Y' of FIG. 7 are illustrated. In FIGS. 12A to 12E, some components taken along the line Y-Y' of FIG. 7 are illustrated in the process order. Referring to FIGS. 12A to 12E, an exemplary method of manufacturing the integrated circuit device 100 described with reference to FIGS. 4 to 8 will be described.

Figure 12A:
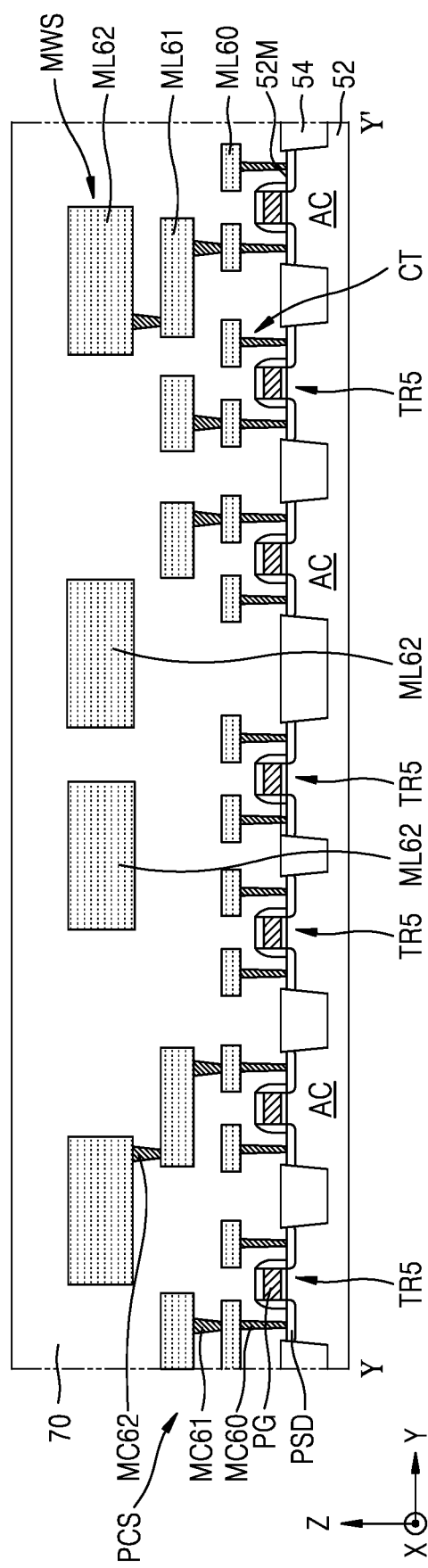
FIGS. 12A to 12E are related, cross-sectional views illustrating a method of manufacturing an integrated circuit device according to embodiments of the inventive concept in the process order.

Referring to FIG. 12A, the peripheral circuit structure PCS including the substrate 52, the circuits CT, the multilayer wiring structure MWS, and the interlayer insulating layer 70 is formed.

Figure 12B:
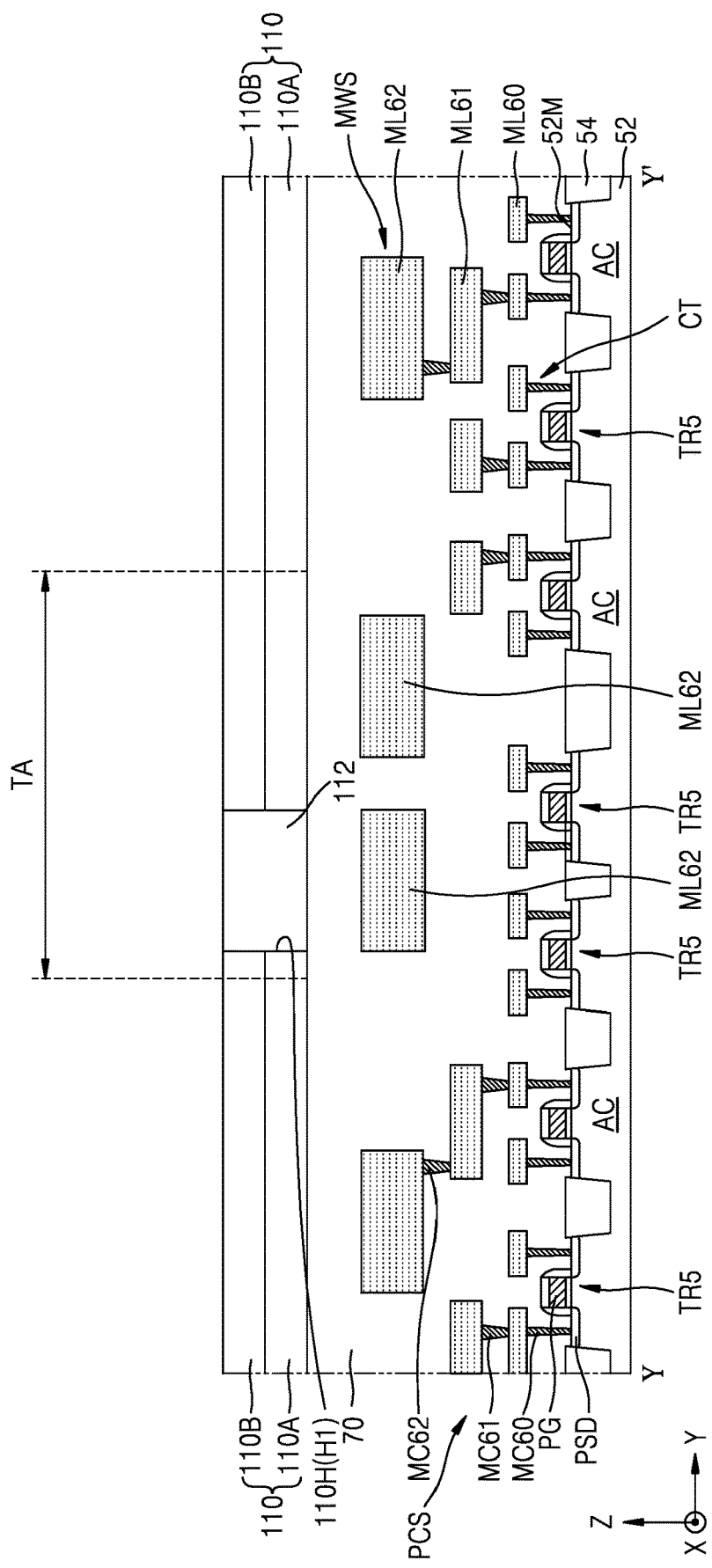

Referring to FIG. 12B, the conductive plate 110 is formed by sequentially forming the metal plate 110A and the semiconductor plate 110B on the peripheral circuit structure PCS and, after forming the through holes 110H in the through electrode region TA of the conductive plate 110, the buried insulating layer 112 filling the through holes 110H is formed.

Figure 12C:
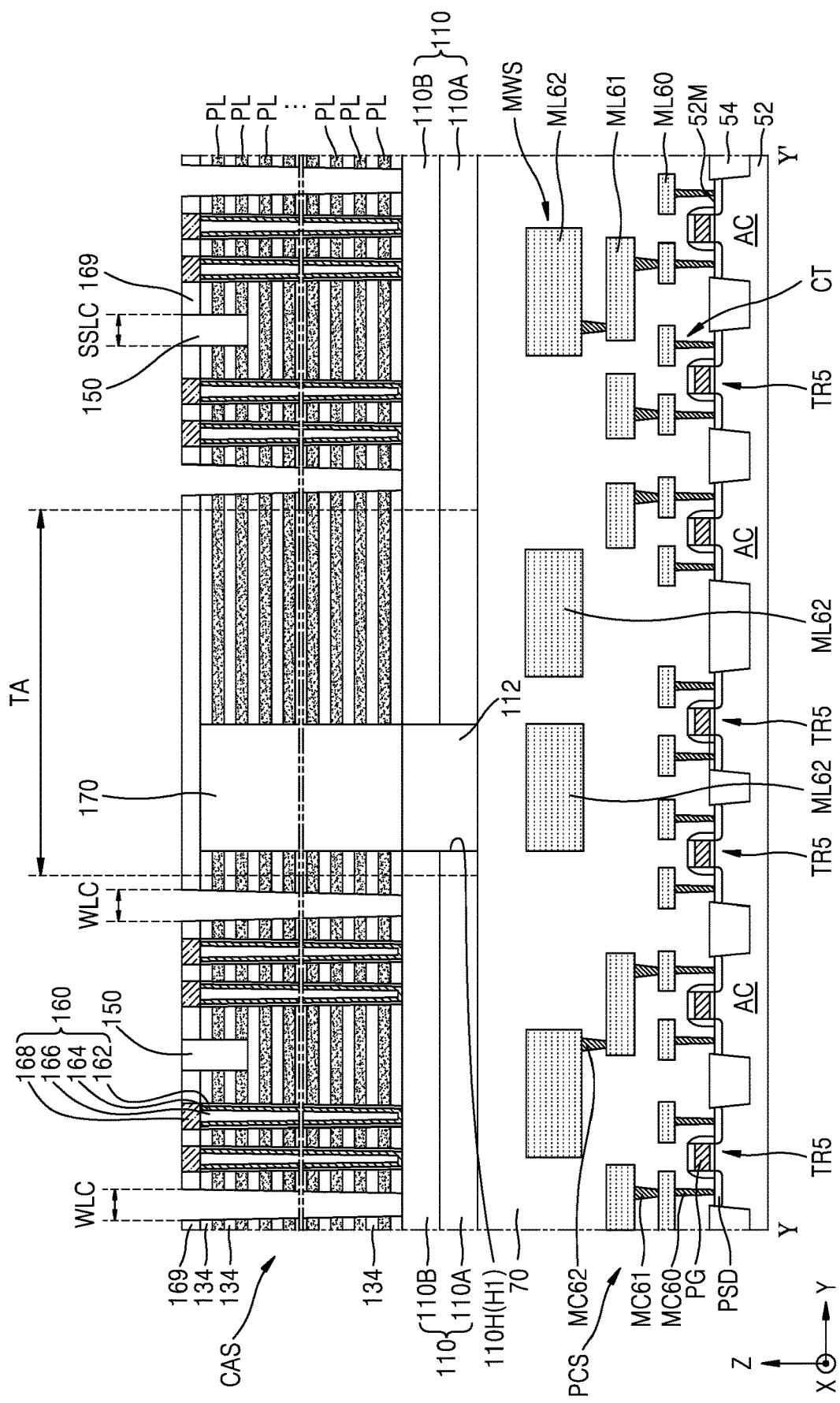

Referring to FIG. 12C, on the conductive plate 110 and the buried insulating layer 112, the insulating layers 134 and sacrificial layers PL are alternately stacked one by one. Each of the sacrificial layers PL may be formed of silicon nitride, silicon carbide, or polysilicon. The sacrificial layers PL may secure spaces for forming the gate lines 130 during subsequent process(es).

Then, parts of the insulating layers 134 and the sacrificial layers PL are replaced by the insulating structure 170 and an upper insulating layer 169 is formed. The upper insulating layer 169 may cover the uppermost insulating layer 134 among the insulating layers 134 and the insulating structure 170. Then, the channel structures 160 passing through the upper insulating layer 169, the insulating layers 134, and the sacrificial layers PL are formed and the string selection line cut regions SSLC and the insulating layers 150 filling the string selection line cut regions SSLC are formed.

Then, the word line cut regions WLC passing through the upper insulating layer 169, the insulating layers 134, and the sacrificial layers PL are formed. Through the word line cut regions WLC, the upper surface of the conductive plate 110 may be exposed.

Figure 12D:
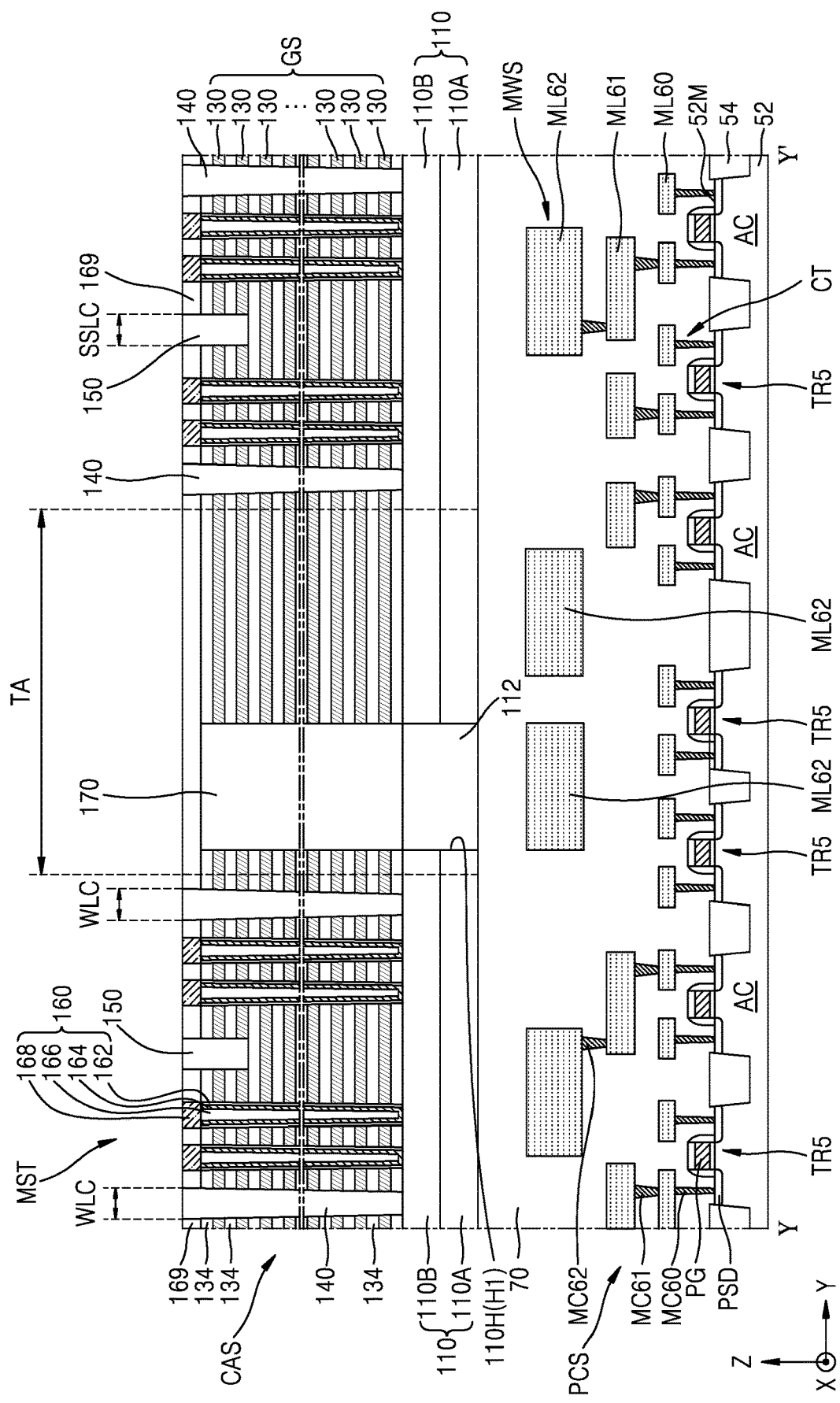

Referring to FIG. 12D, in the resultant structure of FIG. 12C, through the word line cut regions WLC, the sacrificial layers PL may be replaced by the gate lines 130. In some embodiments, in order to replace the sacrificial layers PL (refer to FIG. 12C) by the gate lines 130, after providing an empty space between each two of the insulating layers 134 by selectively removing the sacrificial layers PL exposed through the word line cut regions WLC, by filling a conductive material in the empty space, the gate lines 130 may be formed.

Then, insulating layers 140 filling the word line cut regions WLC are formed.

Figure 12E:
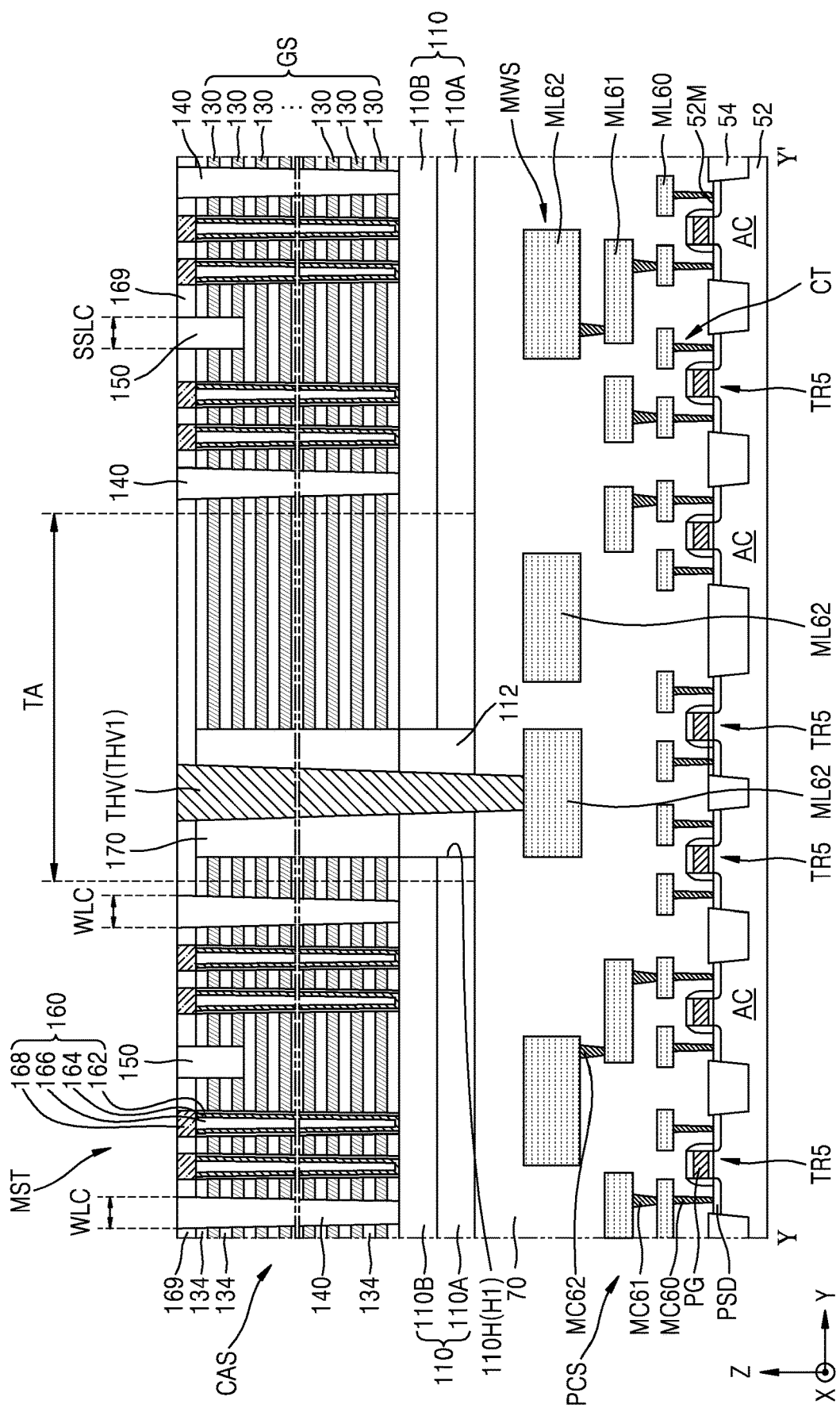

Referring to FIG. 12E, the through electrodes THV (refer to FIG. 7) contacting the upper surface of the peripheral circuit wiring layer ML62 through the upper insulating layer 169, the insulating structure 170, the buried insulating layer 112, and the interlayer insulating layer 70 are formed. The peripheral circuit wiring layer ML62 contacting the through electrodes THV may be connected to the page buffer 34 (refer to FIG. 1) among the circuits CT formed in the peripheral circuit structure PCS.

Then, as illustrated in FIG. 8, an insulating layer 193 covering an upper surface of the resultant structure in which the through electrodes THV are formed is formed and a plurality of first contact pads 194 ("first contact pads") connected to the drain regions 168 of the channel structures 160 through the insulating layer 193 and a plurality of second contact pads 195 ("second contact pads") connected to the through electrodes THV may be formed. Then, by forming the bit lines BL on the first contact pads 194 and the second contact pads 195, the integrated circuit device 100 described with reference to FIGS. 4 to 8 may be manufactured. The bit lines BL may be connected to the channel structures 160 and the through electrodes THV through the first contact pads 194 and the second contact pads 195.

In order to manufacture the integrated circuit device 200 illustrated in FIGS. 9A, 9B and 9C, a method similar to the method of manufacturing the integrated circuit device 100 described with reference to FIGS. 12A to 12C may be used.

That is, in the process described with reference to FIG. 12C, after forming the insulating layers 134 and the sacrificial layers PL on the conductive plate 110 and the buried insulating layer 112, before replacing parts of the insulating layers 134 and the sacrificial layers PL by the insulating structure 170, after etching parts of the insulating layers 134 and the sacrificial layers PL, and dividing the etched parts into mold patterns arranged on the tiles regions 110R of the conductive plate 110, an insulating layer 214 filling a space between each two of the divided mold patterns may be formed. Then, parts of the insulating layers 134 and the sacrificial layers PL may be replaced by the insulating structure 170 (refer to FIG. 12C) and the upper insulating layer 169 may be formed on the insulating structure 170 and the mold patterns. Then, on the resultant structure in which the upper insulating layer 169 is formed, the processes of FIGS. 12C to 12E may be performed. In the process described with reference to FIG. 12E, while the through electrodes THV are formed, the external contact plugs ECP passing through the insulating layer 214 may be formed.

In other exemplary embodiments, the external contact plugs ECP may be formed before or after formation of the through electrodes THV. The external contact plugs ECP may contact the upper surface of the conductive plate 110 through the insulating layer 214.

In order to manufacture the integrated circuit device 300 illustrated in FIG. 10, a method similar to the method of manufacturing the integrated circuit device 200 illustrated in FIGS. 9A to 9C may be used. While the insulating structure 170 is formed in the process described with reference to FIG. 12C, in the edge region of the tile region 110R, other parts of the insulating layers 134 and the sacrificial layers PL may be replaced by an insulating structure 370. In the process described with reference to FIG. 12E, while the through electrodes THV are formed, instead of the external contact plugs ECP illustrated in FIGS. 9A to 9C, the external contact plugs ECP3 may be formed.

In other exemplary embodiments, the external contact plugs ECP3 may be formed before or after the formation of the of through electrodes THV. The external contact plugs ECP3 may contact the upper surface of the conductive plate 110 through the insulating structure 370.

In order to manufacture the integrated circuit device 400 illustrated in FIG. 11, a method similar to the method of manufacturing the integrated circuit device 200 illustrated in FIGS. 9A to 9C may be used. While the insulating structure 170 is formed in the process described with reference to FIG. 12C, in the center region RC of the tile region 110R, partial regions of the insulating layers 134 and the sacrificial layers PL may be replaced by center insulating structures (not shown). While the through electrodes THV are formed in the process described with reference to FIG. 12E, the external contact plugs ECP and the internal contact plugs ICP may be formed. The internal contact plugs ICP may contact the upper surface of the conductive plate 110 through the center insulating structures.

The exemplary methods of manufacturing the integrated circuit devices 100, 200, 300, and 400 illustrated in FIGS. 4 to 11 are described. However, it will be understood by those skilled in the art that integrated circuit devices with various structures may be manufactured by applying various modifications and changes without departing from the spirit and scope of the following claims.

Figure 13:
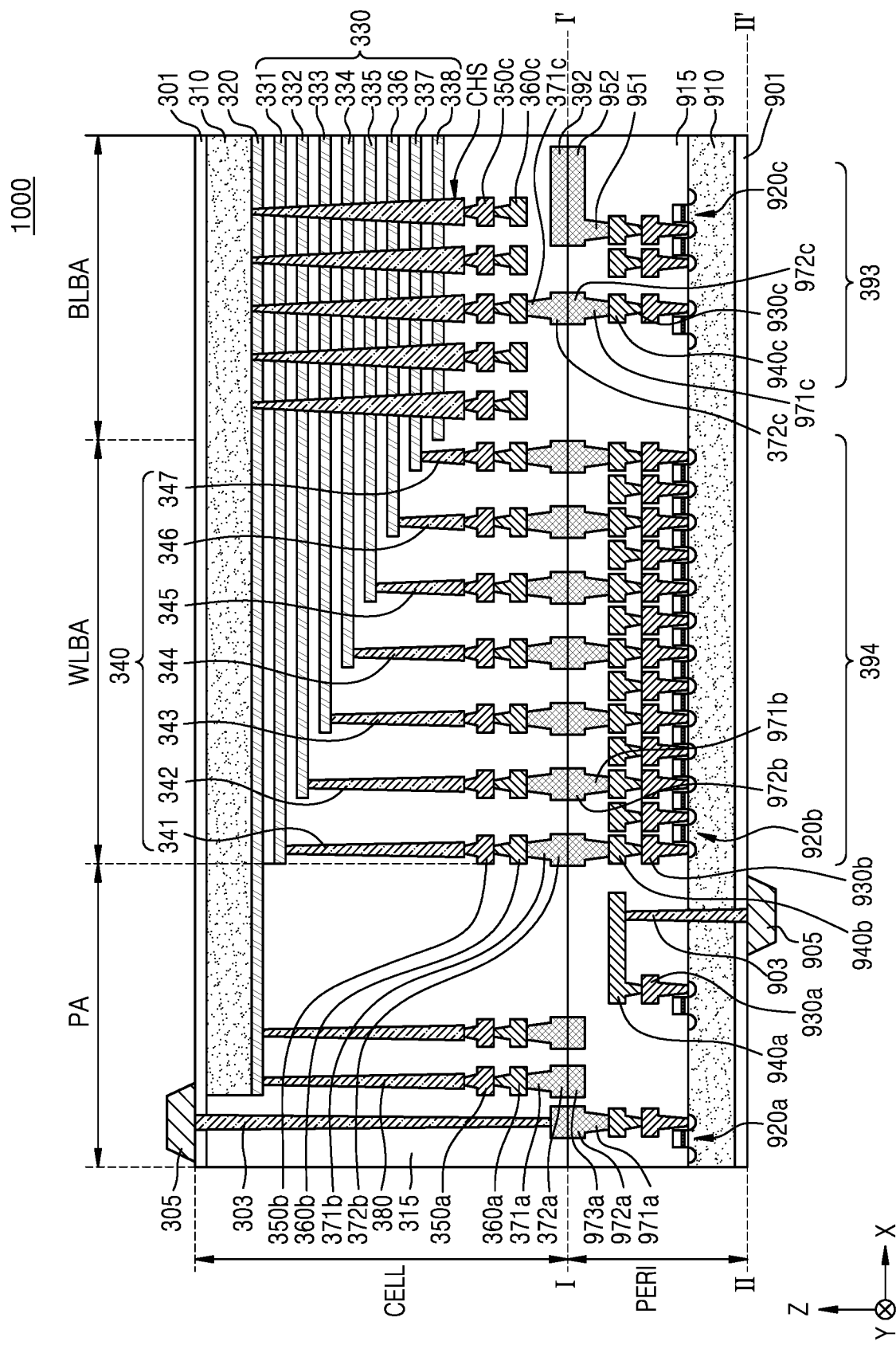
FIG. 13 illustrates a memory device having a chip-to-chip (C2C) structure, according to example embodiments of the inventive concepts.

FIG. 13 illustrates a memory device having a chip-to-chip (C2C) structure, according to example embodiments of the inventive concepts.

Referring to FIG. 13, a memory device 1000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1000 may include an external pad bonding area PA, a word line bonding area WLBA, and a bit line bonding area BLBA.

The peripheral circuit region PERI may include a first substrate 910, an interlayer insulating layer 915, a plurality of circuit elements 920a, 920b, and 920c formed on the first substrate 910, first metal layers 930a, 930b, and 930c respectively connected to the plurality of circuit elements 920a, 920b, and 920c, and second metal layers 940a, 940b, and 940c formed on the first metal layers 930a, 930b, and 930c. In an example embodiment, the first metal layers 930a, 930b, and 930c may be formed of tungsten having relatively high resistance, and the second metal layers 940a, 940b, and 940c may be formed of copper having relatively low resistance.

In an example embodiment illustrate in FIG. 13, although the first metal layers 930a, 930b, and 930c and the second metal layers 940a, 940b, and 940c are shown and described, they are not limited thereto, and one or more metal layers may be further formed on the second metal layers 940a, 940b, and 940c. At least a portion of the one or more metal layers formed on the second metal layers 940a, 940b, and 940c may be formed of aluminum or the like having a lower resistance than those of copper forming the second metal layers 940a, 940b, and 940c.

The interlayer insulating layer 915 may be disposed on the first substrate 910 and cover the plurality of circuit elements 920a, 920b, and 920c, the first metal layers 930a, 930b, and 930c, and the second metal layers 940a, 940b, and 940c. The interlayer insulating layer 915 may include an insulating material such as silicon oxide, silicon nitride, or the like.

Lower bonding metals 971b and 972b may be formed on the second metal layer 940b in the word line bonding area WLBA. In the word line bonding area WLBA, the lower bonding metals 971b and 972b in the peripheral circuit region PERI may be electrically connected to upper bonding metals 371b and 372b in a bonding manner, and the lower bonding metals 971b and 972b and the upper bonding metals 371b and 372b may be formed of aluminum, copper, tungsten, or the like. Further, the upper bonding metals 371b and 372b in the cell region CELL may be referred as first metal pads and the lower bonding metals 971b and 972b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (the Z direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CHS may extend in a direction, perpendicular to the upper surface of the second substrate 310, and pass through the plurality of word lines 330, the at least one string select line, and the at least one ground select line. The channel structure CHS may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (the Y direction), parallel to the upper surface of the second substrate 310.

In an example embodiment illustrated in FIG. 13, an area in which the channel structure CHS, the bit line 360c, and the like are disposed may be defined as the bit line bonding area BLBA. In the bit line bonding area BLBA, the bit line 360c may be electrically connected to the circuit elements 920c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 971c and 972c connected to the circuit elements 920c of the page buffer 393.

In the word line bonding area WLBA, the plurality of word lines 330 may extend in a second direction (the X direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 971b and 972b of the peripheral circuit region PERI in the word line bonding area WLBA.

The plurality of cell contact plugs 340 may be electrically connected to the circuit elements 920b providing a row decoder 394 in the peripheral circuit region PERI. In an example embodiment, operating voltages of the circuit elements 920b providing the row decoder 394 may be different than operating voltages of the circuit elements 920c providing the page buffer 393. For example, operating voltages of the circuit elements 920c providing the page buffer 393 may be greater than operating voltages of the circuit elements 920b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 305 and 905 may be disposed in the external pad bonding area PA. Referring to FIG. 13, a lower insulating film 901 covering a lower surface of the first substrate 910 may be formed below the first substrate 910, and a first input-output pad 905 may be formed on the lower insulating film 901. The first input-output pad 905 may be connected to at least one of the plurality of circuit elements 920a, 920b, and 920c disposed in the peripheral circuit region PERI through a first input-output contact plug 903, and may be separated from the first substrate 910 by the lower insulating film 901. In addition, a side insulating film may be disposed between the first input-output contact plug 903 and the first substrate 910 to electrically separate the first input-output contact plug 903 and the first substrate 910.

Referring to FIG. 13, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 920a, 920b, and 920c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z direction). Referring to FIG. 13, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 905 and the second input-output pad 305 may be selectively formed. For example, the memory device 1000 may include only the first input-output pad 905 disposed on the first substrate 910 or the second input-output pad 305 disposed on the second substrate 310. Alternatively, the memory device 1000 may include both the first input-output pad 905 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1000 may include lower metal patterns 971a, 972a, and 973a formed in the peripheral circuit region PERI. Each of the lower metal patterns 971a, 972a, and 973a may be connected to corresponding pattern from among upper metal patterns 371a and 372a formed in the cell region CELL. In the peripheral circuit region PERI, the lower metal pattern 973a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 971b and 972b may be formed on the second metal layer 940b in the word line bonding area WLBA. In the word line bonding area WLBA, the lower bonding metals 971b and 972b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 952 formed in the uppermost metal layer of the peripheral circuit region PERI, and having the same shape as the lower metal pattern 952 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a peripheral circuit structure;
   a cell array structure, including gate lines, overlapping the peripheral circuit structure and disposed on the peripheral circuit structure in a vertical direction;
   a conductive plate interposed between the peripheral circuit structure and the cell array structure, the conductive plate including a through electrode region in which through holes are formed, the through holes including first through holes and second through holes;
   conductive lines spaced apart from the conductive plate with the cell array structure interposed between the conductive lines and the conductive plate; and
   through electrodes connected to the conductive lines and extending to the peripheral circuit structure through the cell array structure and the through holes of the conductive plate, wherein:
   all the first through holes from among the through holes in the through electrode region are arranged along a first straight line extending in a first horizontal direction,
   all the second through holes from among the through holes in the through electrode region are arranged along a second straight line extending in parallel with the first straight line and spaced apart from the first straight line in a second horizontal direction, perpendicular to the first horizontal direction,
   each of the first through holes is staggered with respect to each of the second through holes along the first horizontal direction, and
   the first through holes and the second through holes pass through only the conductive plate among the conductive plate and the cell array structure in the vertical direction.

2. The integrated circuit device of claim 1, wherein the conductive plate comprises:
   first conductive regions, each having a width in the first horizontal direction which is limited by two adjacent first through holes; and
   second conductive regions, each having a width in the first horizontal direction which is limited by two adjacent second through holes, wherein:
   the first conductive regions are connected to the second conductive regions through local regions of the conductive plate, and
   each of the local regions is arranged between a closest one of the first through holes and a closest one of the second through holes.

3. The integrated circuit device of claim 1, wherein a selected first through hole is spaced apart from a selected second through hole in the second horizontal direction, the selected second through hole being closest to the selected first through hole among the second through holes.

4. The integrated circuit device of claim 1, wherein:
the through electrodes include first through electrodes passing through the first through holes and second through electrodes passing through the second through holes, and
the conductive lines include first conductive lines connected to the first through electrodes and second conductive lines connected to the second through electrodes.

5. The integrated circuit device of claim 4, wherein:
the conductive lines further include third conductive lines arranged between the first conductive lines and the second conductive lines, and
the third conductive lines are not connected to the first through electrodes and the second through electrodes.

6. The integrated circuit device of claim 1, wherein each of the through electrodes is connected to one of the conductive lines.

7. The integrated circuit device of claim 1, wherein:
the conductive lines include bit lines extending in the second horizontal direction,
only selected first bit lines among the bit lines are connected to the through electrodes and remaining bit lines, excluding the selected first bit lines, are not connected to the through electrodes, and
the selected first bit lines are respectively an Nth bit line in an arrangement of the bit lines, where "N" is an integer ranging from 2 to 4.

8. The integrated circuit device of claim 1, wherein no memory cell exists in the through electrode region.

9. The integrated circuit device of claim 1, wherein the first through holes do not overlap with the second through holes in the second horizontal direction.

10. The integrated circuit device of claim 1, wherein a portion of the conductive plate is between the first through holes and the second through holes, and
the portion of the conductive plate extends continuously from an edge of each of the first through holes to an edge of each of the second through holes.

11. An integrated circuit device comprising:
a peripheral circuit structure;
a cell array structure, including gate lines, overlapping the peripheral circuit structure and disposed on the peripheral circuit structure in a vertical direction;
a conductive plate interposed between the peripheral circuit structure and the cell array structure and including through holes;
conductive lines spaced apart from the conductive plate with the cell array structure interposed between the conductive lines and the conductive plate; and
through electrodes connected to the conductive lines and extending to the peripheral circuit structure through the cell array structure and the through holes, wherein
the through holes include first through holes arranged along a first straight line extending in a first horizontal direction and second through holes arranged along a second straight line extending in parallel with the first straight line and spaced apart from the first straight line by the conductive plate in a second horizontal direction, and
the first through holes and the second through holes pass through only the conductive plate among the conductive plate and the cell array structure in the vertical direction.

12. The integrated circuit device of claim 11, wherein the first through holes and the second through holes are arranged so that one first through hole and one second through hole are alternately repeated in the first horizontal direction and, among the first through holes and the second through holes, one first through hole and one second through hole adjacent to each other are offset from each other in the second horizontal direction.

13. The integrated circuit device of claim 11, wherein the conductive plate comprises:
first conductive regions, each having a width in the first horizontal direction which is limited by two adjacent first through holes; and
second conductive regions, each having a width in the first horizontal direction which is limited by two adjacent second through holes, wherein:
the first conductive regions are connected to the second conductive regions through local regions of the conductive plate, and
each of the local regions is arranged between a closest one of the first through holes and a closest one of the second through holes.

14. The integrated circuit device of claim 11, wherein a selected first through hole is spaced apart from a selected second through hole in the second horizontal direction, the selected second through hole being closest to the selected first through hole among the second through holes.

15. The integrated circuit device of claim 11, wherein:
the through electrodes include first through electrodes passing through the first through holes and second through electrodes passing through the second through holes, and
the conductive lines include first conductive lines connected to the first through electrodes and second conductive lines connected to the second through electrodes.

16. The integrated circuit device of claim 15, wherein:
the conductive lines further include third conductive lines arranged between the first conductive lines and the second conductive lines, and
the third conductive lines are not connected to the first through electrodes and the second through electrodes.

17. The integrated circuit device of claim 11, wherein each of the through electrodes is connected to one of the conductive lines.

18. The integrated circuit device of claim 11, wherein:
the conductive lines include bit lines extending in the second horizontal direction,
only selected first bit lines among the bit lines are connected to the through electrodes and remaining bit lines, excluding the selected first bit lines, are not connected to the through electrodes, and
the selected first bit lines are respectively an Nth bit line in an arrangement of the bit lines, where "N" is an integer ranging from 2 to 4.

19. The integrated circuit device of claim 11, wherein the first through holes do not overlap with the second through holes in the second horizontal direction.

20. The integrated circuit device of claim 11, wherein a portion of the conductive plate is between the first through holes and the second through holes, and
the portion of the conductive plate extends continuously from an edge of each of the first through holes to an edge of each of the second through holes.

* * * * *